(12) United States Patent
Fuse et al.

(10) Patent No.: US 8,300,734 B2
(45) Date of Patent: Oct. 30, 2012

(54) FREQUENCY CONVERTING SYSTEM

(75) Inventors: Masaaki Fuse, Atsugi (JP); Hitoshi Sekiya, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 410 days.

(21) Appl. No.: 12/556,085

(22) Filed: Sep. 9, 2009

(65) Prior Publication Data
US 2010/0220778 A1 Sep. 2, 2010

(30) Foreign Application Priority Data

Feb. 27, 2009 (JP) ................. 2009-045595

(51) Int. Cl.
H03D 1/24 (2006.01)
H04L 27/00 (2006.01)
H03M 1/20 (2006.01)
H03M 1/12 (2006.01)
(52) U.S. Cl. ........ 375/321; 375/316; 375/324; 375/340; 455/323; 455/307; 455/318; 455/266; 341/144; 341/155; 341/50
(58) Field of Classification Search .............. 375/219, 375/222, 240.26–240.29, 295, 304, 306, 375/307, 315, 316, 339, 340, 341; 341/51, 341/50, 144, 148, 173, 155, 178, 185, 181; 455/323, 307, 318, 266, 131, 303
See application file for complete search history.

(56) References Cited

U.S. PATENT DOCUMENTS

| | | | | |
|---|---|---|---|---|
| 6,473,013 B1 * | 10/2002 | Velazquez et al. | ............ | 341/120 |
| 7,466,767 B2 * | 12/2008 | Chu et al. | ............ | 375/321 |
| 7,885,178 B2 * | 2/2011 | Maltsev et al. | ............ | 370/208 |
| 8,111,183 B2 * | 2/2012 | Gomez et al. | ............ | 341/144 |
| 2002/0169603 A1 * | 11/2002 | Sculley | ............ | 704/229 |
| 2004/0165680 A1 * | 8/2004 | Kroeger | ............ | 375/321 |
| 2005/0193419 A1 | 9/2005 | Lindstrom et al. | | |
| 2005/0242990 A1 * | 11/2005 | Lawrence et al. | ........ | 342/357.12 |
| 2005/0245199 A1 * | 11/2005 | Batra et al. | ............ | 455/73 |
| 2006/0198475 A1 * | 9/2006 | Wu et al. | ............ | 375/346 |
| 2006/0267814 A1 * | 11/2006 | Asami | ............ | 341/120 |
| 2009/0174822 A1 * | 7/2009 | Pugel | ............ | 348/731 |

FOREIGN PATENT DOCUMENTS

JP 2-47563 A 2/1990

OTHER PUBLICATIONS

Kuphaldt, Tony R., Lessons in Electric Circuits, vol. 2—AC, Jul. 25, 2007, 6th Edition, pp. 1-570.*
German Office Action dated Aug. 22, 2012 (and English translation thereof) in counterpart German Application No. 10 2009 040 775.8.

* cited by examiner

*Primary Examiner* — Sam K Ahn
*Assistant Examiner* — Linda Wong
(74) *Attorney, Agent, or Firm* — Holtz, Holtz, Goodman & Chick, PC

(57) ABSTRACT

In a frequency converting system, an input signal x(t) is supplied to a signal branching section for dividing a predetermined frequency domain into M bands, extracting signal components of the respective divided bands. The respective signal components and local signals each including a frequency difference corresponding to a predetermined intermediate frequency with respect to a center frequency of each band are input to a frequency converting part. The signals of the respective divided bands are converted into signals of intermediate frequency bands each including the predetermined intermediate frequency as the center frequency, the conversion outputs are sampled by using a common clock signal, whereby the conversion outputs are converted into digital signals. Further, after being subjected to phase correction processing, the digital signals are subjected to frequency conversion and combination processing by a signal regeneration part.

3 Claims, 13 Drawing Sheets

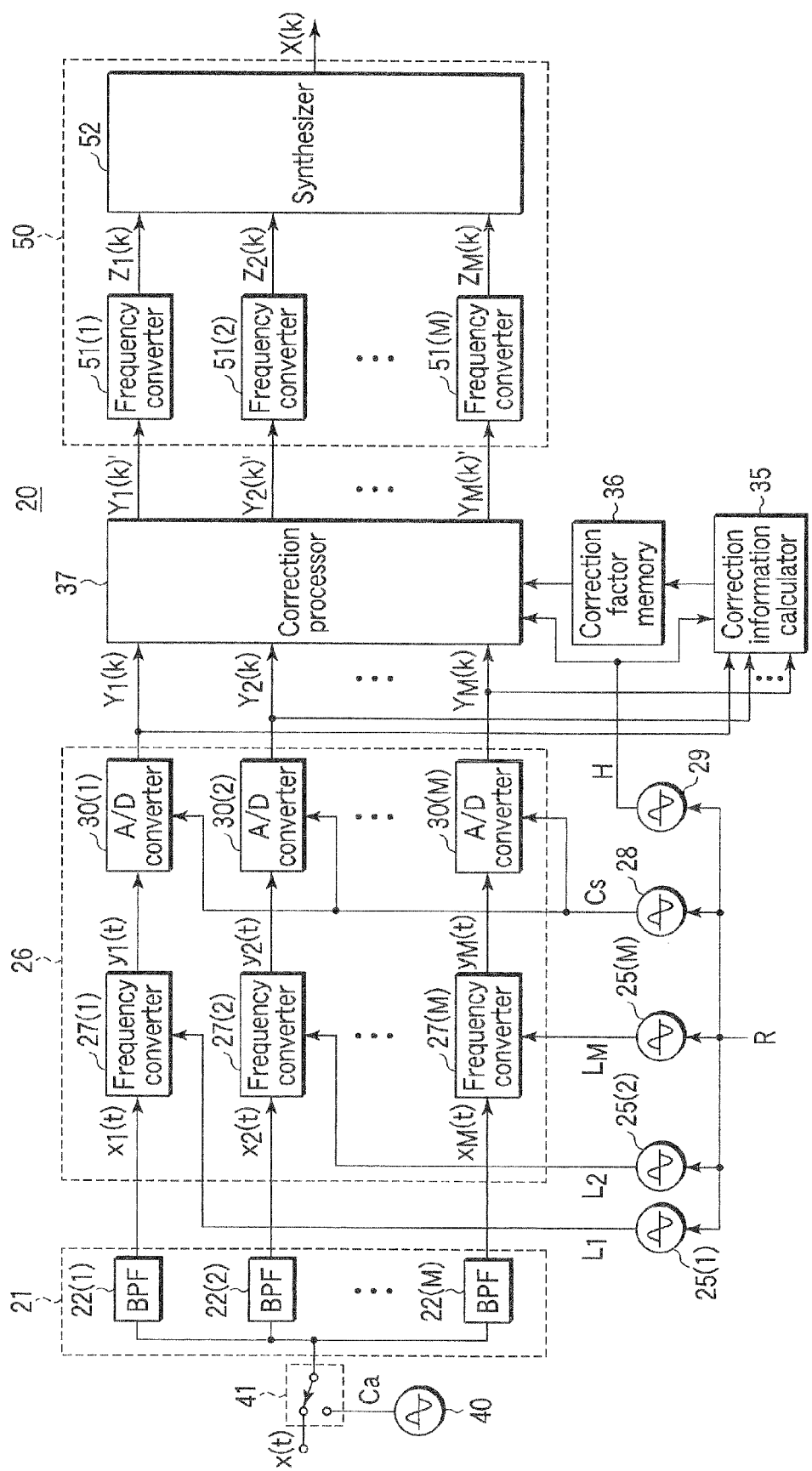
F I G. 1

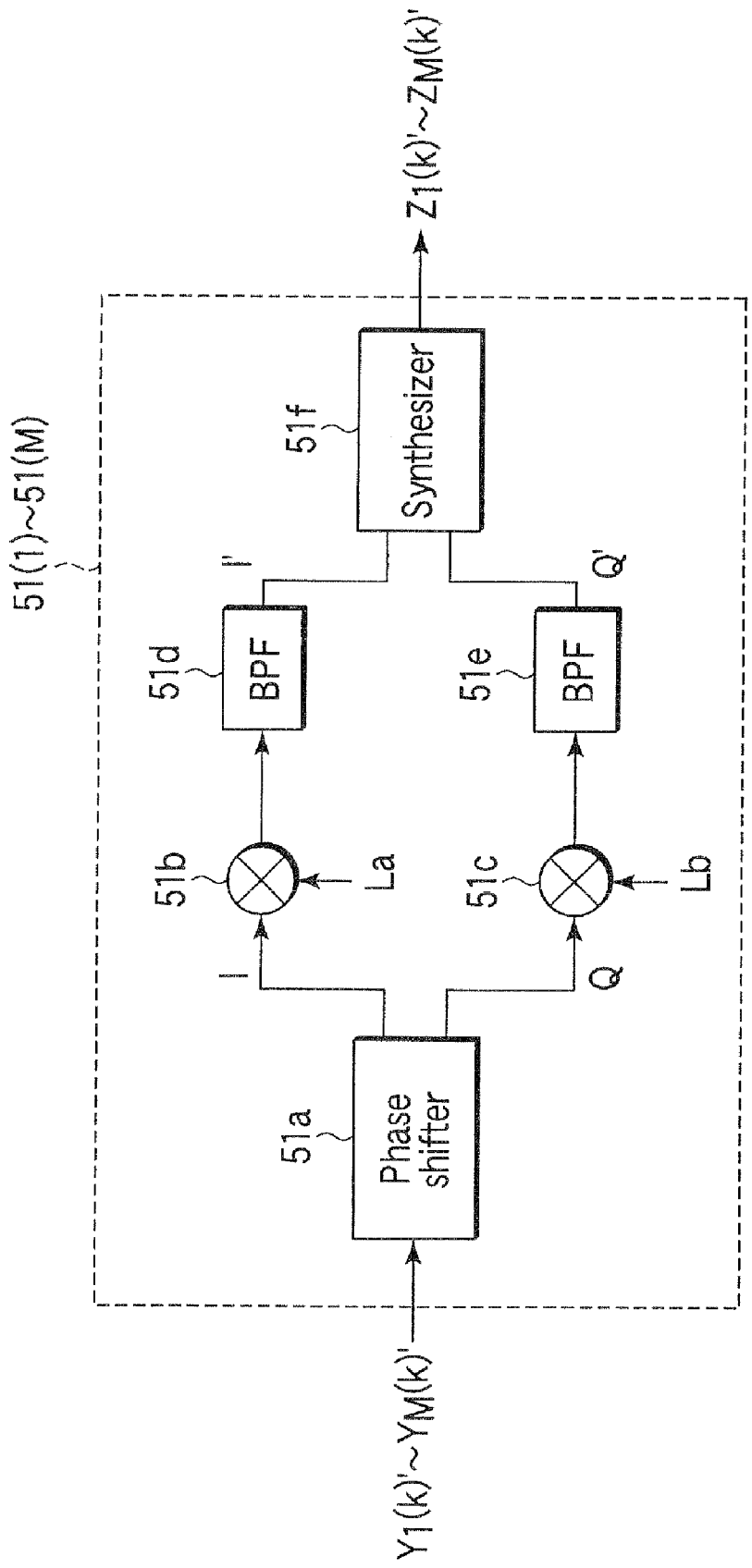
F I G. 6

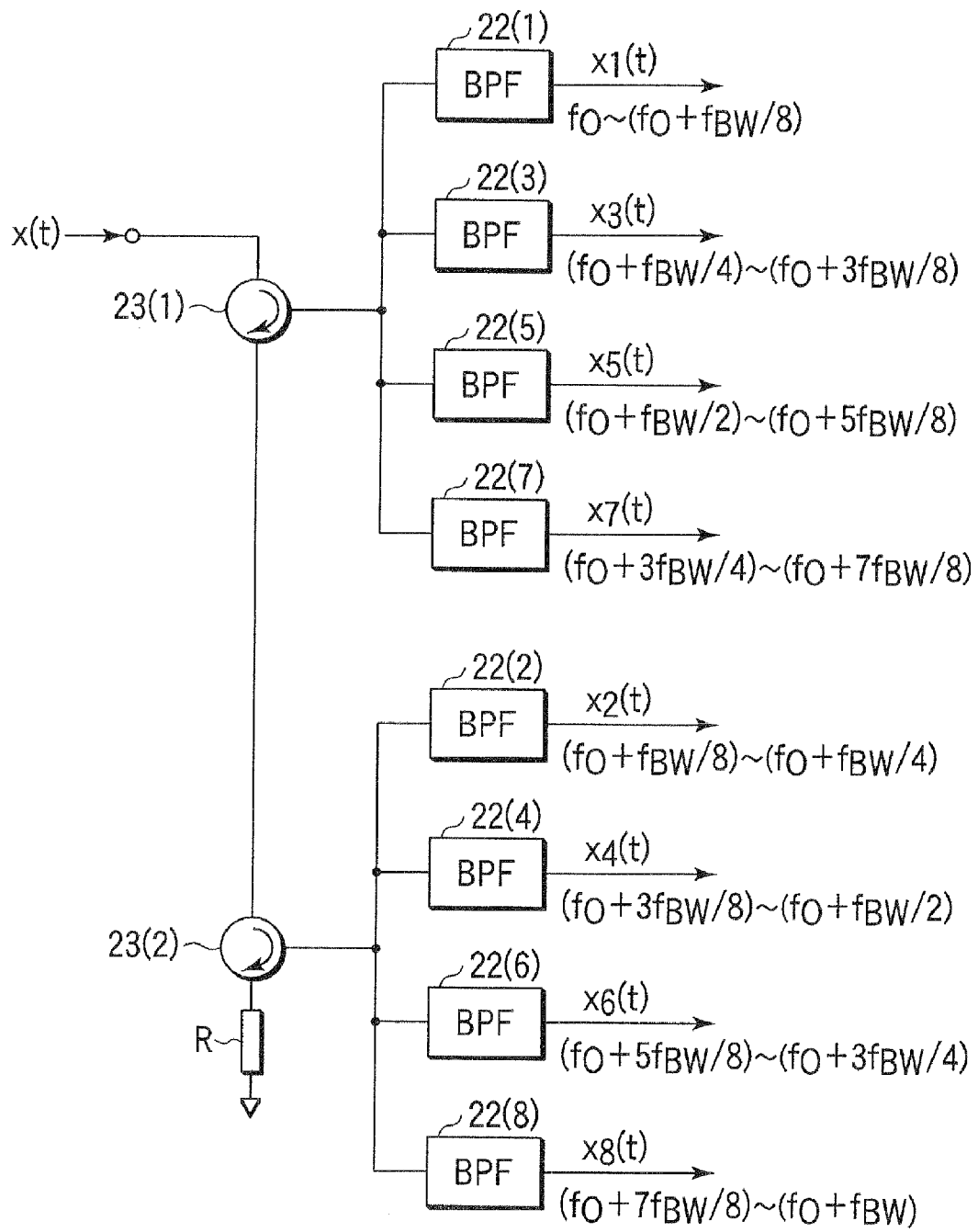
F I G. 7

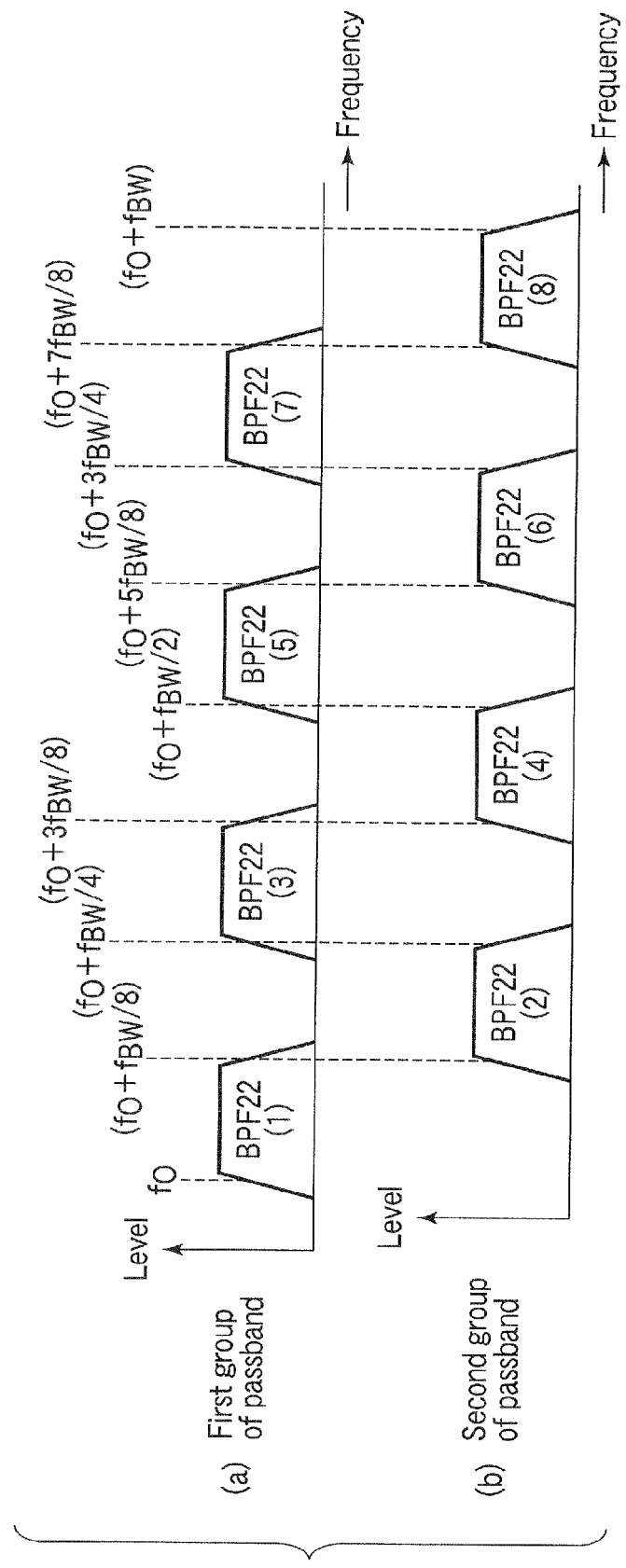
F I G. 8

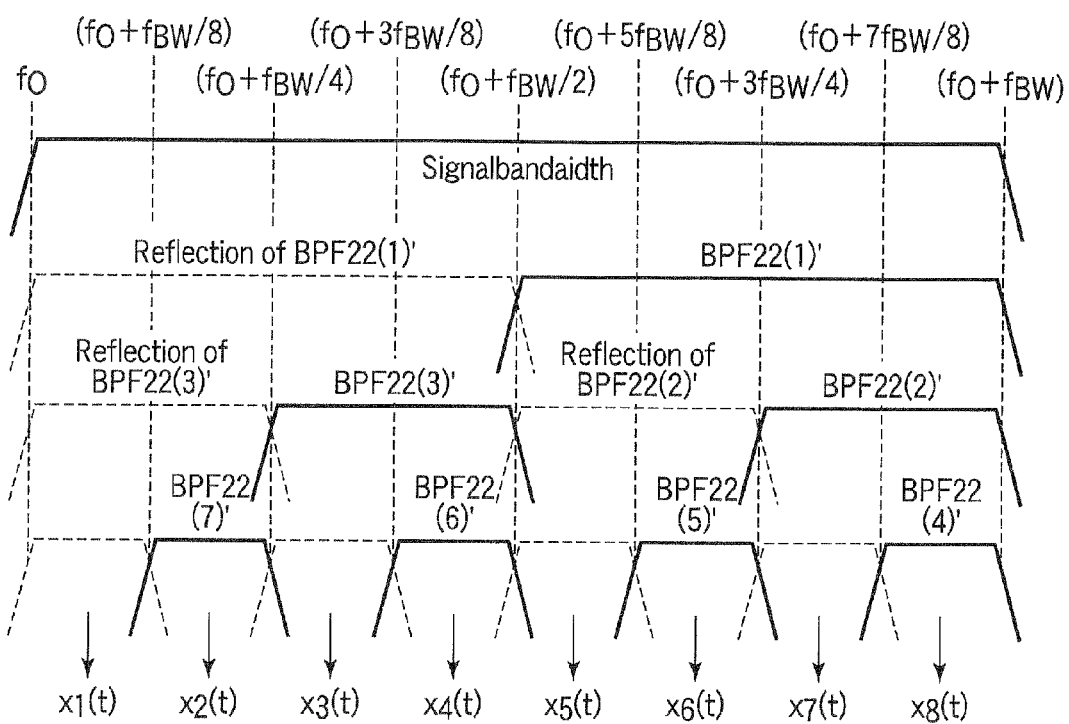
F I G. 10

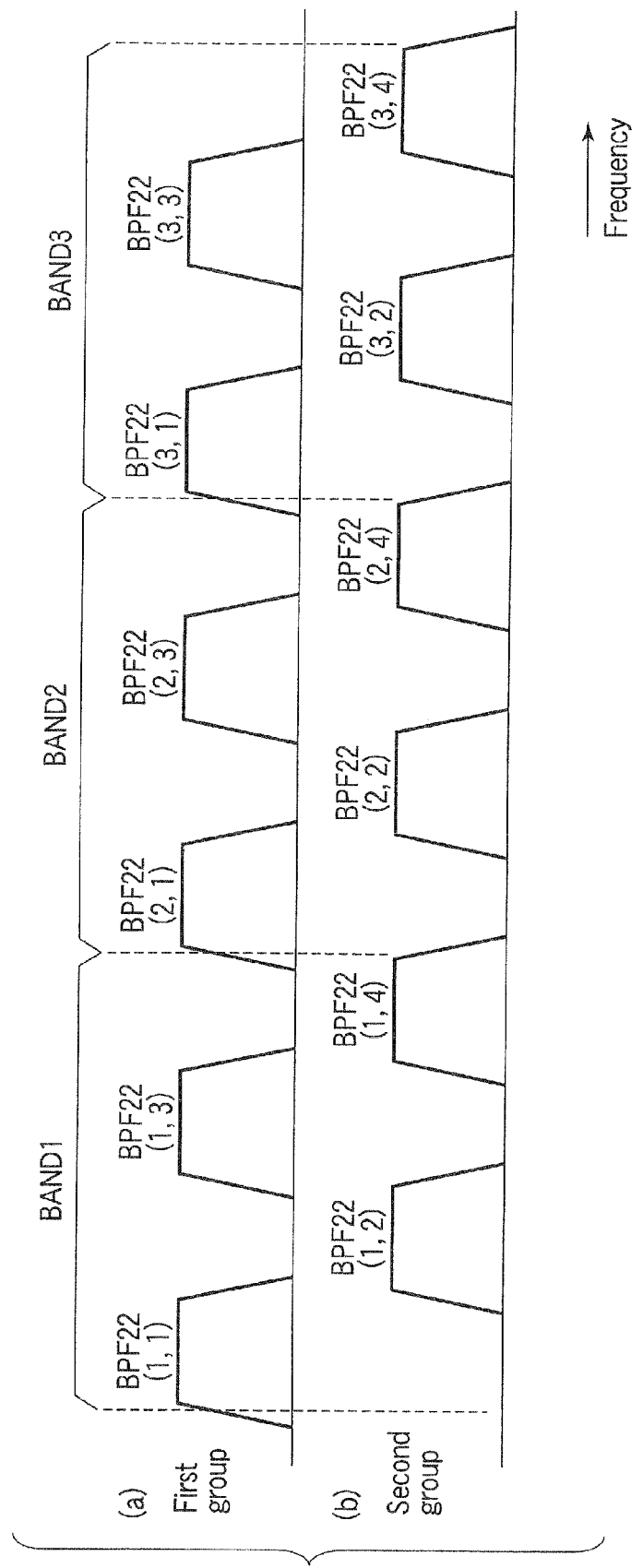
F I G. 12

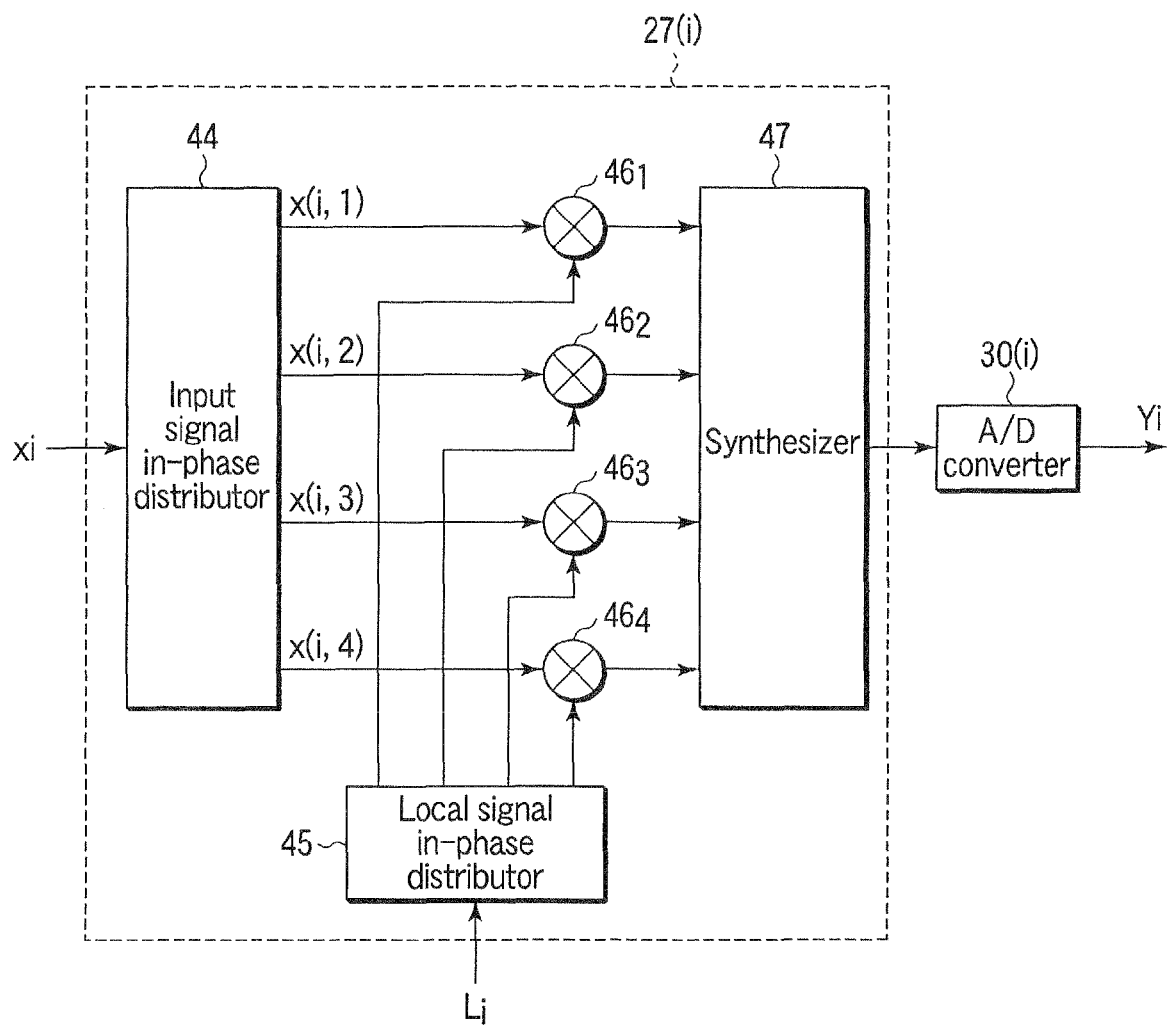
F I G. 13

FREQUENCY CONVERTING SYSTEM

CROSS-REFERENCE TO RELATED APPLICATIONS

This application is based upon and claims the benefit of priority from prior Japanese Patent Application No. 2009-045595, filed Feb. 27, 2009, the entire contents of which are incorporated herein by reference.

BACKGROUND OF THE INVENTION

1. Field of the Invention

The present invention relates to a frequency converting system for waveform-analyzing a high-frequency and broadband analog signal utilized in communication such as mobile communication, and the like or converting a frequency for a digital analysis device for spectrum-analyzing the analog signal and, more particularly, to a frequency converting system capable of reducing distortion caused in a converted wave resulting from instantaneous power contained in a broadband analog signal, and realizing a broadband converted wave of a high dynamic range.

2. Description of the Related Art

A wireless signal utilized in communication such as mobile communication is a modulated wave in a high-frequency band of several GHz or more, and a wide band of several tens of MHz or higher. As an apparatus for carrying out analysis such as spectrum analysis of a signal in such a high-frequency band and wide band, an analog spectrum analyzer has conventionally been used.

It is known that the analog spectrum analyzer includes a circuit configuration as shown in FIG. 15 as disclosed in JP-A H02-47563 (KOKAI)). In the spectrum analyzer, an analog signal x(t) to be measured is input to a mixer 12 to which a local signal from a local signal generator 11 is supplied. The analog signal x(t) is mixed with the local signal L in the mixer 12, and a mixing signal is output from the mixer 12 to a band-pass filter 13 of a narrow band. In this band-pass filter 13, a difference frequency component between the analog signal x(t) and local signal L is extracted from the mixing signal, and the extracted signal is output therefrom. Frequencies of the local signal L are swept in the wide band. Concomitantly with the sweep of the frequencies, the level of each frequency component contained in the analog signal x(t) is detected from the output signal from the band-pass filter 13, and the waveform or spectrum of the analog signal x(t) is analyzed.

However, when the analog signal x(t) to be measured is the broadband modulated wave as described above, peak power of a very large ratio of peak power to average power is contained in the analog signal x(t) and, in the spectrum analyzer described above, all the power of the analog signal x(t) is input to the mixer 12. Accordingly, such an analog signal x(t) causes inter-modulation distortion to occur in the output signal of the mixer beyond the appropriate operation range of the mixer 12, and causes an error to occur in the measurement result.

In order to prevent the inter-modulation distortion from occurring, normally an attenuator is provided in the preceding stage of the mixer 12, and a circuit configuration for attenuating the peak power of the input signal in such a manner that the peak power of the input signal becomes in the appropriate range is employed. However, in this circuit configuration, there is the problem that the level of the average power input to the mixer 12 is lowered by the attenuator, consequently, the S/N ratio of the signal is lowered, and the measurement dynamic range becomes narrow.

Further, as a circuit system for solving this problem, there is a filter selection system in which a plurality of filters different from each other in the band are provided in the preceding stage of the mixer 12 so that the filters can be selected, and a filter in the preceding stage is selected in accordance with the frequency of the local signal L supplied to the mixer 12. Further, as another circuit system, there is a tracking system in which a filter of a variable-frequency type is provided in the preceding stage of the mixer 12, and the frequency of the filter is changed to follow the frequency of the local signal. However, each of these systems is a system in which the spectrum of the input signal is analyzed by the sweep of the local signal L, and hence there is the problem that the analog signal x(t) cannot be theoretically measured in real time.

BRIEF SUMMARY OF THE INVENTION

An object of the present invention is to provide a frequency converting system which converts, in order to analyze a spectrum of a broadband signal of a high-frequency band in real time, the broadband signal of the high-frequency band into a signal of a lower-frequency band in which digital processing is made easier, in a high dynamic range.

In order to achieve the above-mentioned object, according to an aspect of the invention, there is provided a frequency converting system comprising:

input means to which an input signal x(t) including a predetermined frequency domain {f0 to (f0+fBW)} is input, an analog signal to be converted being included in the predetermined frequency domain;

local signal generation means for outputting a local signal (L, L1 to LM) of a frequency including a predetermined intermediate frequency difference determined in advance with respect to a center frequency of the predetermined frequency domain {f0 to (f0+fBW)};

frequency conversion means for mixing the input signal x(t) and local signal (L, L1 to LM) with each other to generate a mixing signal, extracting an intermediate frequency signal including an intermediate frequency band including a predetermined intermediate frequency as a center frequency from the mixing signal to convert the input signal into the intermediate frequency signal, and further converting the intermediate frequency signal into digital signals to output an output signal including the predetermined intermediate frequency band; and a signal regeneration section for subjecting the digital signals output from the frequency converting section to frequency conversion processing, combining the digital signals which have been subjected to the frequency conversion processing with each other, and regenerating the signal included in the predetermined frequency domain as a digital signal of a frequency domain (f0' to f0'+fBW) with a width identical with the width of the predetermined frequency domain, wherein the input means includes a signal branching section for dividing the predetermined frequency domain (f0 to f0+fBW) into M (M is an integer equal to or larger than 1) bands, and extracting signal components of the respective divided bands to output the extracted signal components in parallel with each other, the local signal generation means includes M local signal generators provided to correspond to each of the signals of the respective bands output from the signal branching section, for outputting M local signals each including a frequency (fc1±fi, fc2±fi, . . . , fcM±fi) including a difference corresponding to a predetermined intermediate frequency (fi) with respect to a center frequency (fc1 to fcM) of each of the bands, and the frequency conversion means includes a frequency converting section for mixing signals of the respective bands output from the signal branching section, and local signals corresponding to the signals of the respective bands output from the local signal generators with each other, converting the signals of the bands into signals of intermediate frequency bands each including the intermediate frequency as the center frequency, converting the signals of the intermediate frequency bands into digital signals, and outputting the converted digital signals.

Further, according to a second aspect of the invention, there is provided the frequency converting system according to the first aspect of the invention, wherein the signal branching section branches the signal to be converted into a plurality of (M) signals, inputs the branched signals to M band-pass filters each for passing only the signal component of each of the divided bands therethrough, and causes the band-pass filters to output the signal components of the bands in parallel with each other.

Further, according to a third aspect of the invention, there is provided the frequency converting system according to the first aspect of the invention, wherein in the signal branching section, the M band-pass filters each for passing only the signal component of each of the divided bands therethrough are separated into a plurality of (N) groups in each of which the band-pass filters are combined in such a manner that the pass bands of the band-pass filters are not adjacent to each other, the band-pass filters belonging to each group are connected in parallel to a first input/output port of a circulator provided in each group closer to an input port of the circulator when viewed from the input port in the signal transmission direction, further the plurality of (N) circulators are connected to each other in cascade connection in such a manner that a second input/output port of one circulator farther from the input port when viewed from the input port in the signal transmission direction and an input port of the other circulator are connected to each other, and the signal to be converted is supplied to an input port of a circulator of the first stage.

Further, according to a fourth aspect of the invention, there is provided the frequency converting system according to the first aspect of the invention, wherein the signal branching section is configured in such a manner that the signal branching section includes branching units each of which is comprised of a circulator, and a band-pass filter connected to a first input/output port of the circulator closer to an input port of the circulator when viewed from the input port in the signal transmission direction, for extracting, in a pass band narrower than the predetermined frequency domain, a signal component of at least one of the divided bands, each for separating a signal input to the input port of the circulator into signal components extracted by the band-pass filter, and signal components output from a second input/output port of the circulator farther from the input port of the circulator when viewed from the input port in the signal transmission direction, and the branching units are connected in a tree-like form in a plurality of stages in a state where the pass band widths of the branching units are narrowed from the former stage toward the latter stage, and the signal components of the respective bands are output in parallel from the respective branching units in the final stage.

Further, according to a fifth aspect of the invention, there is provided the frequency converting system according to any one of the first to fourth aspects of the invention, wherein the frequency converting section is comprised of a plurality of frequency converters for mixing signals of the respective bands output from the signal branching section, and local signals output from the local signal generators corresponding to the signals of the respective bands with each other, and converting the signals of the bands into signals of intermediate frequency bands each including the intermediate frequency as the center frequency, and a plurality of (M) A/D converters for converting the signals of the intermediate frequency bands into which the plurality of frequency converters have converted, into digital signals by using a common sampling clock, and outputting the respective digital signals, and each of the frequency converters is comprised of an input signal in-phase distributor (44) for in-phase branching a signal of each band into a plurality of (K) signals, a local signal in-phase distributor for in-phase branching the local signal into K signals, a plurality of (K) mixers for receiving signals in-phase branched by the input signal in-phase distributor, and local signals in-phase branched by the local signal in-phase distributor, aid mixing the received signals with each other, and a synthesizer for adding up and combining, with each other, outputs of the plurality of mixers.

Further, according to a sixth aspect of the invention, there is provided the frequency converting system according to any one of first to fourth aspects of the invention, wherein the frequency converting section is comprised of a plurality of (M) frequency converters for mixing signals of the respective bands output from the signal branching section (21), and local signals output from the local signal generators corresponding to the signals of the respective bands with each other, converting the signals of the bands into signals of intermediate frequency bands each including the intermediate frequency as the center frequency, converting the intermediate-frequency-band-converted signals into digital signals, and outputting the digital signals, and each of the frequency converters is constituted of an input signal in-phase distributor for in-phase branching a signal of each band into a plurality of (K) signals, a local signal in-phase distributor for in-phase branching the local signal into K signals, a plurality of (K) mixers for receiving signals in-phase branched by the input signal in-phase distributor, and local signals in-phase branched by the local signal in-phase distributor, and mixing the received signals with each other, a plurality of (K) A/D converters for converting outputs of the plurality of mixers into digital signals by using a common sampling clock, and a synthesizer for adding up and combining, with each other, outputs of the plurality of A/D converters.

Further, according to a seventh aspect of the invention, there is provided the frequency converting system according to any one of first to sixth aspects of the invention, further comprising:

a correction factor memory in which a correction factor for correcting a phase error occurring in the digital signal train output from the frequency converting section is stored in advance; and a correction processor which is interposed between the plurality of A/D converters and signal regeneration section, corrects a phase error occurring in the digital signal train output from each of the A/D converters in accordance with the correction factor stored in the correction factor memory, and supplies the corrected digital signal train to the signal regeneration section.

Further, according to a eighth aspect of the invention, there is provided the frequency converting system according to the seventh aspect of the invention, wherein each of the local signals output from the local signal generator is phase-synchronized with a predetermined reference signal, and is set at a frequency of the integral multiple (u1 to uM) of the reference signal, and the correction processor carries out the phase correction processing at periods of a signal of a frequency obtained by multiplying a frequency of the reference signal by a common divisor (U) of each multiple (u1 to uM).

BRIEF DESCRIPTION OF THE SEVERAL VIEWS OF THE DRAWING

FIG. 1 is a block diagram showing the circuit configuration of a frequency converting system according to an embodiment of the present invention.

FIG. 6 is a block diagram showing the circuit configuration of the frequency converter shown in FIG. 1.

FIG. 7 is a block diagram showing the circuit configuration according to another example of the signal branching section shown in FIG. 1.

FIG. 8 is a waveform chart showing pass bands of band-pass filters shown in FIG. 7.

FIG. 10 is a waveform chart showing pass bands of band-pass filters shown in FIG. 9.

FIG. 12 is a waveform chart showing pass bands of band-pass filters shown in FIG. 11.

FIG. 13 is a block diagram showing the circuit configuration according to another example of the frequency converter of the frequency converting section shown in FIG. 1.

DETAILED DESCRIPTION OF THE INVENTION

A frequency converting system according to an embodiment of the present invention will be described below in detail with reference to the accompanying drawings.

FIG. 1 is a block diagram showing the circuit configuration of a frequency converting system 20 according to the embodiment of the present invention. In the frequency converting system 20 shown in FIG. 1, a broadband analog signal in the high-frequency band of several GHz such as the high-frequency band of the OFDM system used in the mobile communication, and extending over a wide band of several tens of MHz is input to a signal branching section 21 as an input signal x(t). In the frequency converting system 20, the input signal x(t) is converted, for the digital signal processing, into a signal of a low frequency band of, for example, several hundred MHz.

In the signal branching section 21, the predetermined frequency domain f0 to (f0+fBW) in which the analog input signal x(t) is included is divided into M consecutive frequency bands, and signal components of the divided bands are extracted and output in parallel. In the circuit according to this embodiment, the input signal x(t) is branched in parallel into M signals, and the M signals are respectively input to M band-pass filters 22(1) to 22(M). Here, M is an integer equal to 2 or larger.

Figure 2:
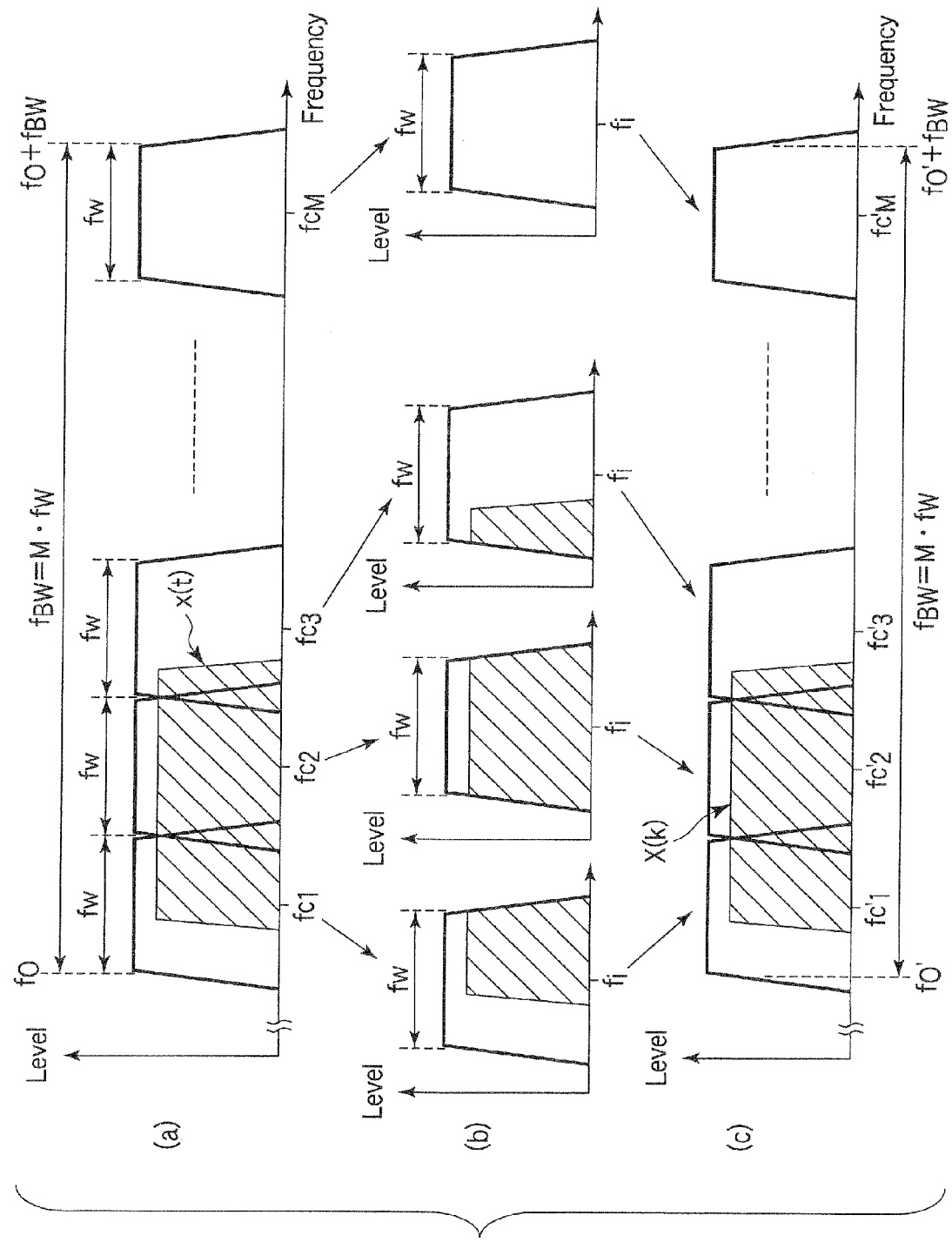
FIG. 2 is waveform chart for explaining the signal processing in the frequency converting system shown in FIG. 1.

As shown in FIG. 2(a), a predetermined frequency domain f0 to (f0+fBW) in which there is the possibility of a signal to be converted being contained is input to the M band-pass filters 22(1) to 22(M). Here when, for example, f0 is 2 GHz (f0=2 GHz), and fBW is 100 MHz (fBW=100 MHz), the predetermined frequency domain f0 to (f0+fBW) corresponds to 2 GHz to 2.1 GHz. Here, M input signals each including an equal frequency width fW=fBW/M are respectively input to the band-pass filters 22(1) to 22(M). Further, when, for example, M is 10 (M=10), the predetermined frequency domain f0 to (f0+fBW) is divided into ten 10 MHz (100/10=10 MHz) bands, and signals $x1(t)$ to $xM(t)$ of the divided bands are selectively extracted by the band-pass filters 22(1) to 22(M). The extracted signals $x1(t)$ to $xM(t)$ are respectively input to M frequency converters 27(1) to 27(M) of a frequency converting section 26 to be described later.

Here, assuming that the center frequencies of the frequency bands extracted by the band-pass filters 22(1) to 22(M) are fc1 to fcM, the pass bands of the band-pass filters 22(1) to 22(M) are respectively set as (fc1±fW/2), (fc2±fW/2), . . . , (fcM±fW/2).

The frequency converting section 26 is constituted of a plurality of frequency converters 27(1) to 27(M), and A/D converters 30(1) to 30(M). In the frequency converting section 26, the signals $x1(t)$ to $xM(t)$ of the respective bands output from the signal branching section 21, and local signals L1 to LM output from local signal generators 25(1) to 25(M) corresponding to the signals of the respective bands are respectively mixed with each other. The signals $x1(t)$ to $xM(t)$ of the bands are converted, by the mixture, into signals of intermediate frequency bands each including an intermediate frequency fc1 to fcM as a center frequency, the signals of the intermediate frequency bands are each converted into digital signals, and the signal train is output from the frequency converting section 26.

The frequency converters 27(1) to 27(M) are provided with the local signal generators 25(1) to 25(M) respectively corresponding to the signals passing through the band-pass filters 22(1) to 22(M). The local signal generators 25(1) to 25(M) generate local signals L1 to LM. Each of the local signal generators 25(1) to 25(M) is constituted of a phase-locked loop (PLL) circuit using a reference signal R common to the frequency fr. Each of the local signals L1 to LM includes a frequency fL1 to fLM provided with an accurate difference of a predetermined intermediate frequency fi of, for example, 50 MHz (fi=50 MHz) with respect to the center frequency fc1 to fcM of each band-pass filter 22(1) to 22(M). Accordingly, the local signal L1 to LM is expressed by fL1 (fc1+fi), fr2=(fc2+fi), . . . , fLM=(fcM+fi) or fL1=(fc1−fi), fL2=(fc2−fi), . . . , fLM=(fcM−fi). Here, the intermediate frequency fi is set at a frequency lower than the lower limit frequency f0 of the predetermined frequency domain f0 to (f0+fBW).

Figure 3:
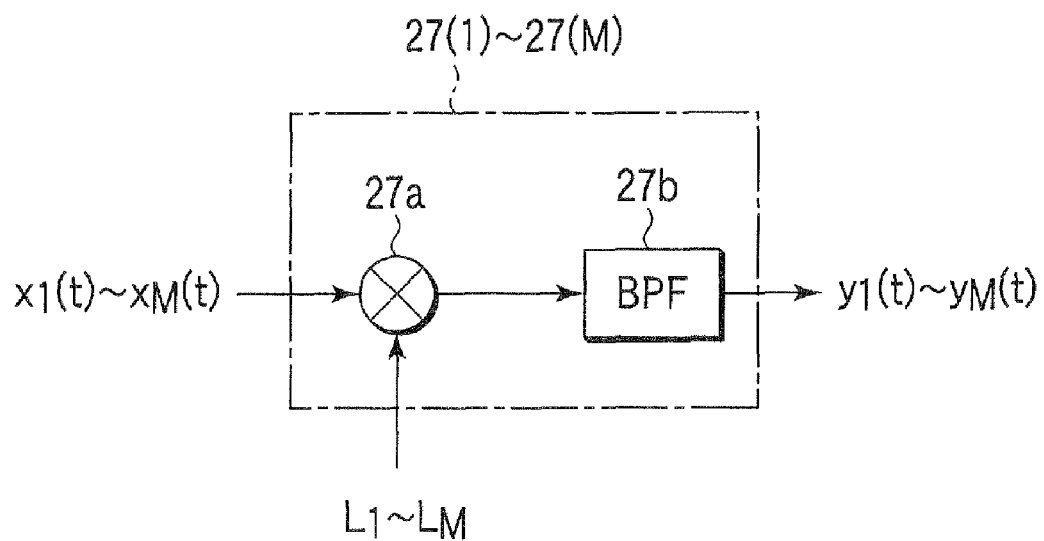
FIG. 3 is a block diagram showing the circuit configuration of each frequency converter in the frequency converting system shown in FIG. 1.

Each of the frequency converters 27(1) to 27(M) includes, for example, the circuit configuration shown in FIG. 3, and is constituted of a mixer 27a and band-pass filter 27b. In each of the frequency converters 27(1) to 27(M), the mixer 27a mixes the output signal x1(t) to xM(t) of each band-pass filter 22(1) to 22(M) with the local signal L1 to LM output from the local signal generator 25(1) to 25(M) corresponding to the band-pass filter 22(1) to 22(M). The mixing signal from the mixer 27a is supplied to the band-pass filter 27b. The band-pass filter 27b extracts, from the mixed components of the mixing signal, a difference frequency component, i.e., the component of the intermediate frequency band (fi±fW/2) including the intermediate frequency fi as the center frequency, and outputs the extracted component. Accordingly, in each frequency converter 27(1) to 27(M), each signal x1(t) to xM(t) is converted into a signal y1(t) to yM(t) including an intermediate frequency band fi±fW/2.

The signal y1(t) to yM(t) output from each frequency converter 27(1) to 27(M) is input to an A/D converter 30(1) to 30(M), then is sampled by a common clock signal Cs output from a clock generator 28, and is converted into digital signals Y1(k) to YM(k). The clock signal Cs is also generated as a signal of a frequency fs (=p·fr) phase-synchronized with the above-mentioned reference signal R. Here, p is an integer.

Here, each of the above-mentioned signals is expressed by each of the following formulas.

First, each of the output signals x1(t) to xM(t) from the respective band-pass filters 22(1) to 22(M) is expressed as follows as a signal of a center frequency fc1 to fcM of the filter. It should be noted that each of θ1 to θM is an initial phase of each signal.

$$x1(t)=\sin(2\pi fc1 \cdot t+\theta 1)$$

$$x2(t)=\sin(2\pi fc2 \cdot t+\theta 2)$$

...

$$xM(t)=\sin(2\pi fcM \cdot t+\theta M)$$

Further, each of the local signals L1 to LM is expressed as follows. It should be noted that each of ψ1 to ψM is an initial phase of each local signal.

$$L1=\sin(2\pi fL1 \cdot t+\psi 1)$$

$$L2=\sin(2\pi fL2 \cdot t+\psi 2)$$

...

$$LM=\sin(2\pi fLM \cdot t+\psi M)$$

Each of the signals y1(t) to yM(t) output for each of the signals x1(t) to xM(t), and local signals L1 to LM from each of the frequency converters 27(1) to 27(M) is expressed as follows. It should be noted that α is a value determined by a conversion factor of each of the frequency converters 27(1) to 27(M).

$$y1(t)=\alpha \cdot \cos(2\pi fit+\theta 1-\psi 1)$$

$$y2(t)=\alpha \cdot \cos(2\pi fit+\theta 2-\psi 2)$$

...

$$yM(t)=\alpha \cdot \cos(2\pi fit+\theta M-\psi M)$$

Accordingly, each of the digital signals Y1(k) to YM(k) output from each of the A/D converters 30(1) to 30(M) is expressed as follows. It should be noted that Δt is a sampling period of the A/D converter, and k is a number 0, 1, 2, . . . indicating the sampling order.

$$Y1(k)=\alpha \cdot \cos(2\pi fik\Delta t+\theta 1-\psi 1)$$

$$Y2(k)=\alpha \cdot \cos(2\pi fik\Delta t+\theta 2-\psi 2)$$

...

$$YM(k)=\alpha \cdot \cos(2\pi fik\Delta t+\theta M-\psi M)$$

Each of all the digital signals Y1(k) to YM(k) is converted into a signal train of an intermediate frequency band including an intermediate frequency fi as a center frequency. Here, it is considered as follows that the signal train Y1(k) to YM(k) is converted, in a state where the signal train Y1(k) to YM(k) maintains the relationship of the original frequency difference, into a signal train of a desired frequency band (f0' to f0'+fBW) in which digital processing of the signal train Y1(k) to YM(k) is enabled. Here, f0' is, for example, 150 MHz (f0'=150 MHz).

In this frequency conversion processing, the frequency of the signal train Y1(k) is shifted by a frequency corresponding to {f0'+(fW/2)−fi}, frequency of the signal train Y2(k) is shifted by a frequency corresponding to {f0'+(3fW/2)−fi}, and frequency of the signal train Y3(k) is shifted by a frequency corresponding to {f0'+(5fW/2)−fi}, whereby the frequency conversion processing can be realized. This frequency conversion processing, i.e., the frequency shift processing can be realized by the digital orthogonal transform technique.

However, when the frequency is simply subjected to shift processing, the initial phase terms (θ1−ψ1), (θ2−ψ2), . . . , (θM−ψM) included in the digital signals Y1(k) to YM(k) are converted as they are, and remain in the converted signals. That is, in the converted signal, in addition to the information θ on the initial phase of the original signal, information ψ on the initial phase of the local signal is included. When all the information items ψ on the initial phases of the respective local signals are identical with each other (ψ1=ψ2= . . . =ψM), the phase relationship of the original signal is maintained. However, the phase is dependent on the frequency, and hence when the frequency of the local signal is set arbitrarily, it is difficult to make all the initial phases of the local signals coincide with each other.

Further, in a circuit in which the input signal is divided into signals of a plurality of paths to be subjected to frequency conversion processing, phase differences between the bands occur due to the characteristic differences of the filters, differences in the signal length, and the like.

Thus, in this embodiment, the frequencies fL1 to fLM of all the local signals are synchronized with a frequency obtained by multiplying the reference signal R by an integer, and are set in such a manner that the following formulas are established with respect to the integer's u1 to uM.

$$fL1=u1 \cdot fr$$

$$fL2=u2 \cdot fr$$

...

$$fLM=uM \cdot fr$$

Accordingly, the phase relationship of the local signal includes a property in which the phase is repeated at periods of a frequency obtained by multiplying a common divisor of an integer of u1 to uM by a frequency fr of the reference signal R. For example, when the frequency fr of the reference signal R is 1 MHz, by setting M at 10 (M=10), the following is obtained.

fL1=1890 MHz u1=1890
fL2=1910 MHz u2=1910
...
fL9=2050 MHz u9=2050
fL10=2070 MHz u10=2070

In this example, the greatest common divisor is 10, and hence the same phase relationship is repeated at periods of 10×1 MHz, i.e., at periods of 0.1 μs.

Accordingly, the signal of the above period phase-synchronized with the reference signal R is generated as a correction timing signal H, and information on the phase difference of the local signal is obtained on the basis of information on each signal train at certain timing of the correction timing signal H, for example, rise timing. On the basis of the information on the phase difference of the local signal, the signal train $Y1(k)$ to $YM(k)$ is subjected to correction processing. As a result of this, it is possible to subject the signal train $Y1(k)$ to $YM(k)$ to frequency conversion processing without being affected by the initial phase difference of the local signal or the difference in the signal path.

In order to carry out the above processing, the frequency converting system 20 of the embodiment includes a correction timing signal generator 29 for outputting the correction timing signal H, correction information calculator 35, correction factor memory 36, and correction processor 37.

Further, the frequency converting system includes a calibration signal generator 40 necessary for calculation processing of correction information as shown in FIG. 1. When the correction information is obtained, a calibration signal Ca provided with a known waveform is generated from the generator 40, and the calibration signal Ca is input to the frequency converting system through a switch 41.

It should be noted that a combination of the correction information calculator 35 and calibration signal generator 40 is applied to the frequency converting system 20. The correction information calculator 35 and calibration signal generator 40 may be provided separately from the frequency converting system 20, and the correction information may be collected at the correction information calculator 35 without utilizing the frequency converting system 20.

When the calibration signal Ca is input, the correction factor calculation mode is set, and the correction information calculator 35 calculates the correction factor. That is, the calibration signal Ca is input to the frequency converting section 26, and is output from the A/D converters 30(1) to 30(M) through the frequency converters 27(1) to 27(M) as digital signals.

Figure 4:
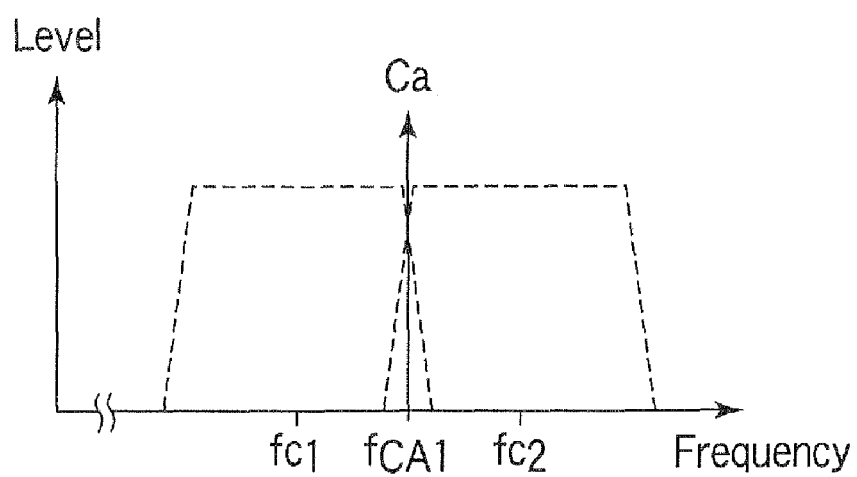
FIG. 4 is a waveform chart of frequency bands for explaining an example of a calibration processing method in the frequency converting system shown in FIG. 1.

On the basis of the digital signals, the correction information calculator 35 calculates a correction factor necessary for phase correction of each of the signals output from the respective frequency converters 27(1) to 21(M). For example, as shown in FIG. 4, a calibration signal Ca with a boundary frequency fCA1 of bands of two band-pass filters 22(1) and 22(2) bands of which are adjacent to each other is input from the calibration signal generator 40 to the frequency converting section 26. On the basis of the input of this calibration signal Ca, the digital signals $Y1(k)$ and $Y2(k)$ output from the A/D converters 30(1) and 30(2) corresponding to the two band-pass filters 22(1) and 22(2) should be ideally equal to each other. However, actually, a phase difference occurs between the digital signals $Y1(k)$ and $Y2(k)$ due to the phase difference between the local signals, variation between the lengths of the signal paths, difference between the A/D converters in characteristic, and the like.

It should be noted that the input signal is branched into a plurality of band-pass filters 22(1) to 22(M) to be subjected to frequency conversion processing, and hence actually an amplitude difference due to the gain difference between the signal paths also occur. However, this amplitude difference can be corrected. That is, a single signal or a signal obtained by combining a plurality of signals frequencies of which are different from each other, and levels of which are known is input in advance to the system, and the gain difference between the signal paths can be obtained from the amplitude information, and the amplitude difference can be corrected on the basis of the information. This gain correction may also be included in the following correction processing. However, in the following description, for the purpose of simplifying the description, the phase correction processing will be described on the assumption that no amplitude difference occurs, and the amplitudes are equal to each other.

The correction information calculator 35 receives the digital signals $Y1(k)$ and $Y2(k)$, and detects a phase difference $\Delta\psi 21$ between $Y1(k)$ and $Y2(k)$.

$$Y1(k)=\alpha\cdot\cos\{2\pi(fCA1-fL1)k\Delta t+\theta CA1-\psi 1\}$$

$$Y2(k)=\alpha\cdot\cos\{2\pi(fCA1-fL2)k\Delta t+\theta CA2-\psi 2-\Delta\Psi 21\}$$

The phase difference $\Delta\Psi 21$ between the above two digital signals can be steadily detected at a timing at which the above-mentioned relationship of the local signal is repeated, i.e., at the rise timing of the correction timing signal H.

Expressing the phase difference $\Psi 21$ in a formula provides the following.

$$\Delta\Psi 21=\theta CA2-\theta CA1+\psi 2-\psi 1$$

This processing is also applied to the next two adjacent band-pass filters 22(2) and 22(3), and a phase difference $\Delta\Psi 32$ between the digital signals $Y2(k)$ and $Y3(k)$ is detected.

Subsequently, the same processing is carried out, whereby phase differences $\Delta\Psi 21, \Delta\Psi 32, \ldots, \Delta\Psi(M-1)M$ between the adjacent bands are obtained.

Figure 5:
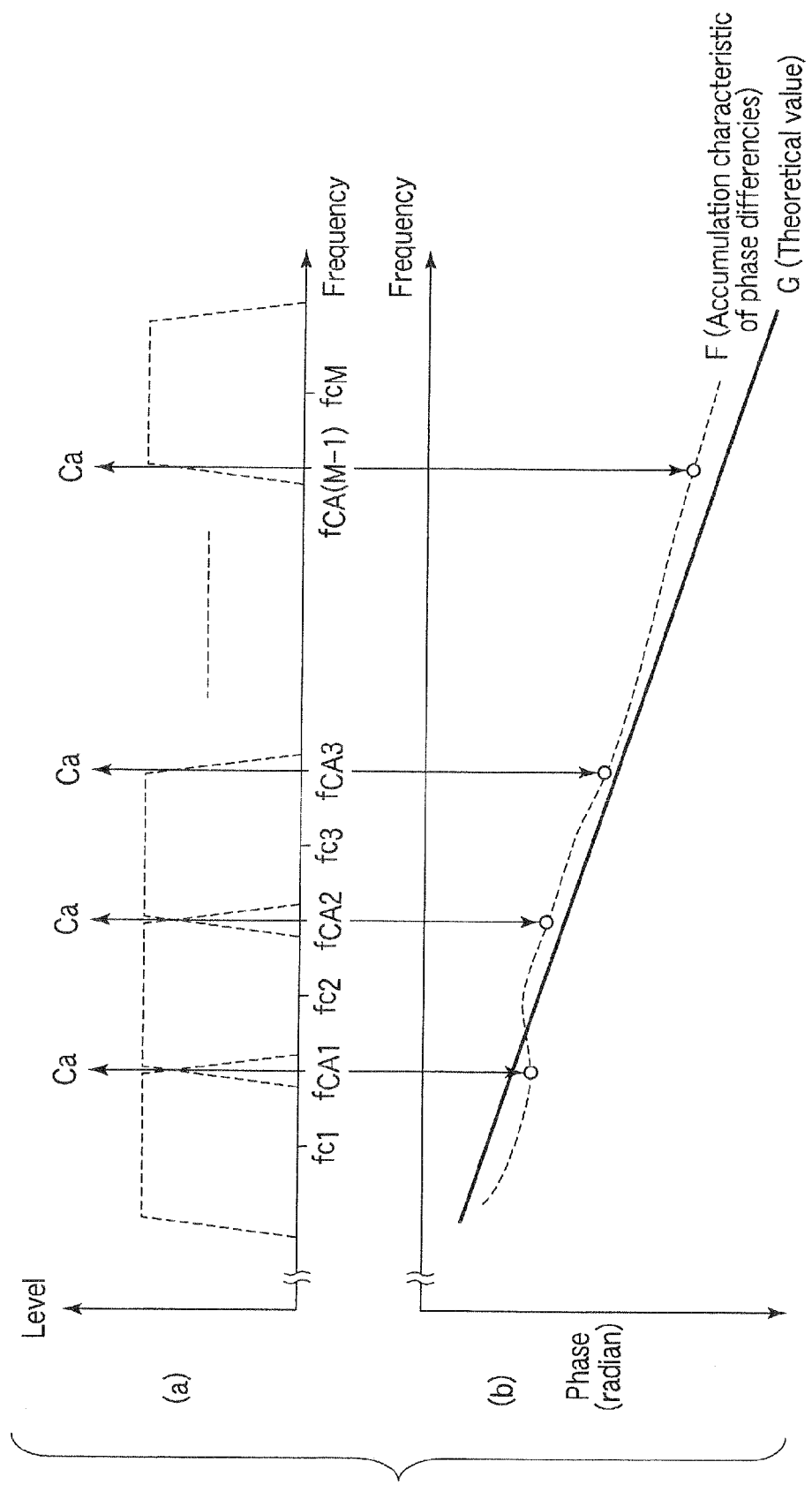
FIG. 5 shows a waveform chart and graph respectively showing frequency bands corrected according to the calibration processing method shown in FIG. 4, and phase difference characteristics of the frequency bands.

FIG. 5(b) shows the characteristic F of the change in the phase difference obtained by the processing shown in FIG. 5(a). The phase differences between the adjacent bands shown in FIG. 5(a) are accumulated, whereby this characteristic F is caused. Here, if the error of the characteristic F is corrected with respect to the theoretical characteristic G shown in FIG. 5(b), it becomes possible to convert the digital signals $Y1(k)$ to $YM(k)$ into digital signals in the desired frequency bands without changing the phase information of the original signal.

The correction information calculator 35 calculates a factor of a digital filter with the characteristic for lessening a difference between the phase difference information obtained by the above processing and the theoretical characteristic, such as a FIR filter as a correction factor, and stores the factor in the above-mentioned correction factor memory 36. It should be noted that this correction factor may be obtained at the time of manufacture or shipment of the system by using a separately provided correction information calculator or calibration signal generator, and may be registered in the correction factor memory 36.

It should be noted that in the above processing, the phase difference information is obtained by using a single calibration signal of the boundary frequency of the adjacent bands. However, the correction factor may also be obtained in such a manner that two calibration signals between which there is a fixed frequency difference $\Delta f$, and in which the mutual phase relationship is known are simultaneously input, a phase difference between digital signals $Y(k)$ obtained with respect to the two signals is detected, and the phase difference becomes equal to the phase difference between the original two signals.

The correction processor 37 is constituted of digital filters provided for the respective bands. The correction processor 37 subjects the respective digital signals Y1(k) to YM(k) to correction processing in accordance with the correction factor stored in the correction factor memory 36, and outputs digital signals Y1(k)' to YM(k)' each maintaining the phase relationship of the original signal to a signal regeneration section 50. It should be noted that when the gain correction described previously is carried out, it is sufficient if the digital signals Y1(k) to YM(k) are subjected to gain correction by causing the digital filters to include gain correction information, and gain-corrected digital signals Y1(k)' to YM(k)' are output from the processor 37.

The corrected digital signals Y1(k)' to YM(k)' are input to the signal regeneration section 50, the digital signals Y1(k)' to YM(k)' are respectively input to orthogonal frequency converters 51(1) to 51(M), and outputs from the frequency converters 51(1) to 51(M) are added up by a synthesizer (or combiner) 52 to be combined into a single signal X(k). Accordingly, the original signal x(t) input to the frequency converting system is converted into a signal X(k) with a desired frequency domain (f0' to f0'+fBW) in which digital processing is enabled. Here, f0' is, for example, 150 MHz (f0'150 MHz).

Each of the orthogonal frequency converters 51(1) to 51(M) is realized by, for example, a circuit configuration shown in FIG. 6. Each of the frequency converters 51(1) to 51(M) is provided with a phase snifter 51a to which the input signal Y(k)' is input, and the input signal Y(k)' is separated into orthogonal components I and Q by the phase shifter 51a. The orthogonal components I and Q output from the phase shifter 51a are respectively input to mixers 51b and 51c. Further, local signals La and Lb which are shifted from each other in phase by 90° at a frequency fL' corresponding to the conversion frequency band are respectively input to the mixers 51b and 51c. The orthogonal components I and Q are respectively multiplied by the local signals La and Lb, and the multiplied signals are respectively input to filters 51d, and 51e. Orthogonal component signals I' and Q' in the desired band are respectively extracted from the multiplied signals by the filters 51d and 51e, are input to the synthesizer 51f, and the orthogonal component signals I' and Q' are added up, and combined in the synthesizer 51f. Accordingly, converted signals Z1(k) to ZM(k) are output from the frequency converters 51(1) to 51(M).

The converted signals Z1(k) to ZM(k) output from the frequency converters 51(1) to 51(M) are combined in a synthesizer 52 to be converted into digital signals X(k) which is converted into digital signals in the desired frequency band (f0' to f0'+fBW) in a state where each of the frequency components of the original signal x(t) accurately maintains the phase relationship thereof as shown in FIG. 2(c).

As described above, in the frequency converting system 20 of the embodiment, although the broadband signal x(t) is input, the signal is band-separated by the plurality of band-pass filters of the signal branching section 21, and the separated signals are respectively subjected to the frequency conversion processing. Therefore, according to this frequency converting system 20, it becomes possible to prevent distortion due to saturation in the mixer of the frequency converter from occurring, and real-time signal processing in the high dynamic range, and with a high S/N ratio is enabled.

Further, the phase shift in each frequency band resulting from carrying out the frequency conversion and A/D conversion processing by using the plurality of band-pass filters in the signal branching section 21 for each of the frequency bands is corrected in the correction processor, and then the signal conversion processing for conversion into the desired frequency band is carried out. Accordingly, in the converted signal, the phase information of the original signal is accurately reproduced, and it is possible to accurately carry out the regeneration processing of the digital modulation signal by using the converted signal.

It should be noted that by making the widths of the respective divided bands equal to each other in the signal branching section 21 of the embodiment, it is possible to carry out the A/D conversion processing for the signal which has been subjected to the frequency conversion in each frequency band in the identical frequency domain, thereby facilitating the characteristic matching. However, the widths of the divided bands are not necessarily set equal. For example, the higher the frequency, the larger the bandwidth is set, whereby the manufacture of the filter is made easier.

Further, the signal branching section 21 of the embodiment is configured in such a manner that the predetermined frequency domain f0 to f0+fBW in which the analog signal to be converted is present is divided into M bands, and the signal components of the respective divided bands are extracted and output in parallel, and the input signal is branched into M series in parallel, and the branched signals are input to M band-pass filters 22(1) to 22(M) through which the signals of the respective bands are passed. However, as for the configuration of the signal branching section 21, in addition to the above configuration, the section 21 can be constituted of, for example, a combination of circulators and band-pass filters as shown in FIG. 7.

The signal branching section 21 shown in FIG. 7 is a circuit example in which M is 8 (M=8), and is constituted of band-pass filters 22(1) to 22(8) identical with those described previously, and N (in this case, N=2) circulators 23(1) and 23(2). Here, the band-pass filters 22(1) to 22(8) are each provided with consecutive bands, and band-pass filters 22(1) to 22(8) denoted by adjacent numbers are provided with bands adjacent to each other.

Here, the band-pass filters 22(1) to 22(8) are separated into a plurality of (N=2) groups in each of which the band-pass filters are combined in such a manner that the pass bands are not adjacent to each other. That is, in this circuit example, the band-pass filters are separated into a first group in which the odd-numbered band-pass filters from the lowest pass band, i.e., the band-pass filters 22(1), 22(3), 22(5), and 22(1) are combined, and second group in which the even-numbered band-pass filters, i.e., the band-pass filers 22(2), 22(4), 22(6), and 22(8) are combined. FIG. 8 shows the pass bands of respective groups, and the pass bands of the filters belonging to the same group are arranged separate from each other. That is, by being separated into the first and second groups, the band-pass filters 22(1) to 22(8) denoted by the numbers adjacent to each other belong to the groups different from each other as shown in FIGS. 8 (a) and (b), and consequently, the band-pass filters 22(1) to 22(8) provided with the bands adjacent to each other belong to the groups different from each other as shown in FIGS. 8 (a) and (b).

Each of the circulators 23(1) and 23(2) is provided with the characteristic of passing a signal in the predetermined frequency domain f0 to (f0+fBW) therethrough with a low loss. Further, in each of the circulators 23(1) and 23(2), a signal input from the input port is transmitted toward the first input/output port closer to the input port when viewed from the input port in the signal transmission direction to be output therefrom. A signal input from the first input/output port is transmitted toward the second input/output port farther from the input port when viewed from the input port in the signal transmission direction to be output therefrom. Here, the input port corresponds to a port positioned at a proximal part of the arrow shown inside each of the circulators 23(1) and 23(2), the first input/output port corresponds to a port positioned at an intermediate part of the arrow shown inside each of the circulators 23(1) and 23(2), and the second input/output port corresponds to a port positioned at a distal end part of the arrow shown inside each of the circulators 23(1) and 23(2).

Further, the band-pass filters 22(1), 22(3), 22(5), and 22(7) of the first group are connected in parallel to the first input/output port of the circulator 23(1), and band-pass filters 22(2), 22(4), 22(6), and 22(8) of the second group are connected in parallel to the first input/output port of the circulator 23(2). Furthermore, the two circulators 23(1) and 23(2) are connected to each other in cascade connection in such a manner that the second input/output port of the one circulator 23(1) and the input port of the other circulator 23(2) are connected to each other, and a signal x(t) to be converted is supplied to the input port of the circulator 23(1) of the first stage of the signal branching section.

In such a circuit configuration in which a plurality of filters are connected through circulators, the input signal x(t) is input to the respective band-pass filters of the first group from the first input/output port of the circulator 23(1) and, from among the components of the signal x(t), the band component of each band-pass filter of the first group passes through each filter. On the other band, from among the components of the input signal x(t), frequency components that cannot pass through the respective band-pass filters are totally reflected due to impedance mismatching, and are input to the first input/output port of the circulator 23(1). Accordingly, the frequency components that cannot pass through the respective band-pass filters of the first group are output from the second input/output port of the circulator 23(1), and are then input to the input port of the circulator 23(2) of the next stage. Further, the above frequency components are input to the respective band-pass filters of the second group from the first input/output port of the circulator 23(2), and then pass through the respective band-pass filters.

It should be noted that the second input/output port of the circulator 23(2) of the final stage is terminated by a resistor R corresponding to the characteristic impedance of the circulator, and unnecessary signal components which can pass through the circulator, and are not included in the frequency domain f0 to (f0+fBW) are terminated by the resistor R.

In the configuration of the above circuit example, the number N is 2 (N=2). Conversely, in the circuit configuration in which, for example, M and N are respectively set at 16 and 2 (M=16, and N=2), the first group is constituted of eight (=M/N) odd-numbered band-pass filters 22(1) to 22(15) when the pass bands are viewed in the order of frequency, and the second group is constituted of eight even-numbered band-pass filters 22(2) to 22(16). It is sufficient if these band-pass filters 22(1) to 22(15) of the first group, and band-pass filters 22(2) to 22(16) of the second group are respectively connected in parallel to the first input/output ports of the two circulators 23(1) and 23(2) which are connected to each other in two-stage cascade connection as described previously.

Further, in the circuit configuration in which, for example, M and N are respectively set at 16 and 4 (M=16, and N=4), the first group is constituted of four band-pass filters 22(1), 22(5), 22(9), and 22(13) pass bands of which are not adjacent to each other, second group is constituted of four band-pass filters 22(2), 22(6), 22(10), and 22(14) pass bands of which are not adjacent to each other, third group is constituted of four band-pass filters 22(3), 22(7), 22(11), and 22(15) pass bands of which are not adjacent to each other, and fourth group is constituted of four band-pass filters 22(4), 22(8), 22(12), and 22(16) pass bands of which are not adjacent to each other. Further, it is sufficient if the filters of the respective groups are respectively connected in parallel to the first input/output ports of the circulators 23(1) to 23(4) which are connected to each other in four-stage cascade connection as described previously.

The integers M and N in the above configuration are arbitrary, and the minimum configuration unit is the case where M and N are each set at 2 (M=N=2), and one of two band-pass filters 22(1) and 22(2) is connected to the first input/output port of one circulator 23(1), and the other is connected to the first input/output port of the other circulator 23(2).

As described above, in a signal branching section 21 provided with a circuit configuration in which groups of band-pass filters pass bands of which are not adjacent to each other are separated from each other by circulators, it is possible to eliminate the difficulty in design resulting from the fact that the characteristics at the boundary part of the pass bands of the filters pass bands of which are adjacent to each other affect each other, and facilitate the design even when the respective band-pass filters are of the variable-frequency type.

Figure 9:
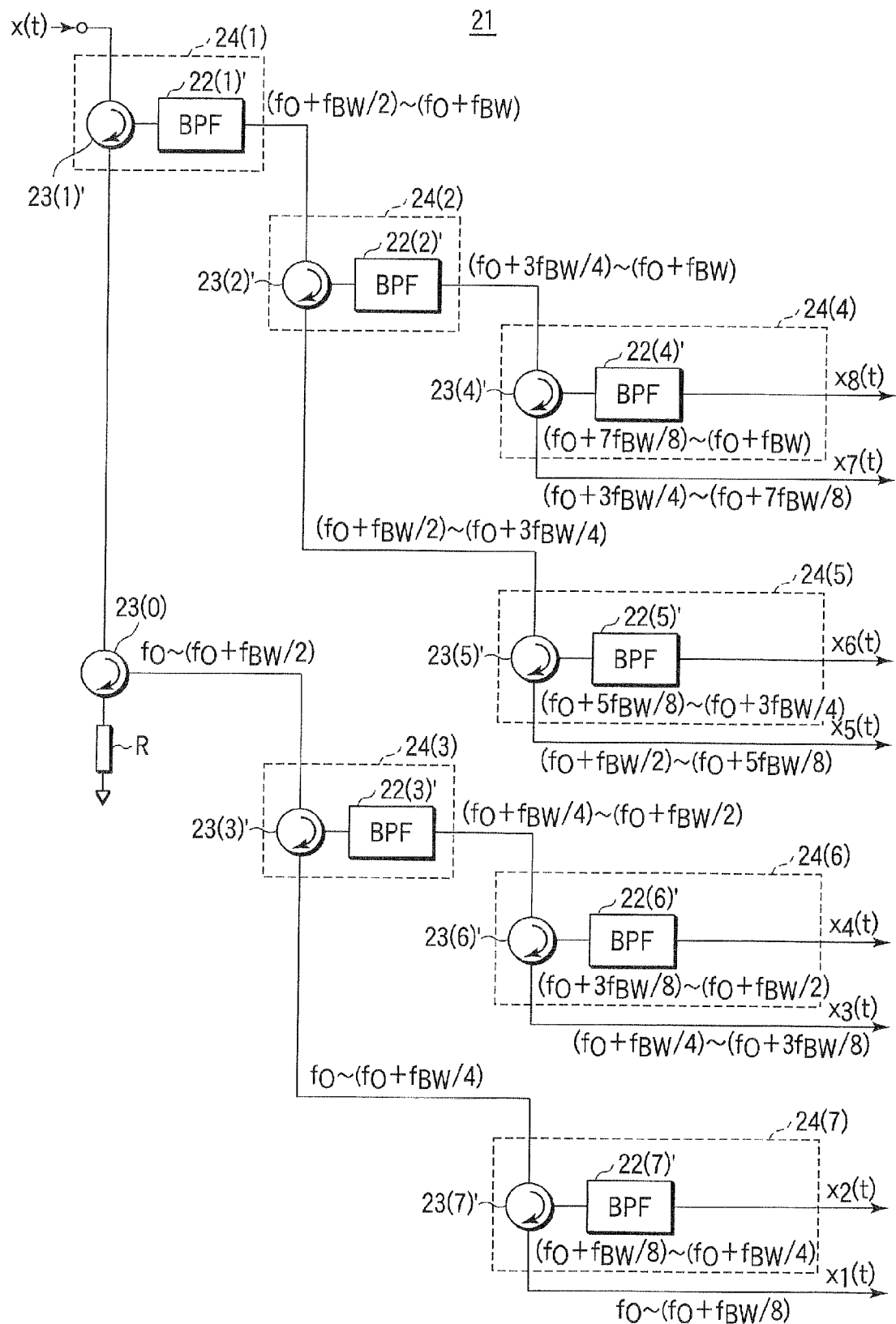
FIG. 9 is a block diagram showing the circuit configuration according to still another example of the signal branching section shown in FIG. 1.

As the signal branching section 21 using the circulators and band-pass filters, the circuit configuration shown in FIG. 9 can also be employed. In the circuit configuration shown in FIG. 9, it is possible to eliminate the difficulty in design resulting from the fact that the characteristics of the filters pass bands of which overlap each other affect each other.

In this circuit configuration example, the circuit is constituted of a circulator 23', and one band-pass filter 22' connected to the first input/output port of the circulator 23', for extracting, in a pass band narrower than the predetermined frequency domain, a signal component of at least one of the divided bands. In this circuit, the signal input to the input port of the circulator 23' is separated by a branching unit 24 into signal components passing through the band-pass filter 22', and signal components which cannot pass through the band-pass filter 22', and are reflected to be output from the second input/output port of the circulator 23', the identical branching units 24 are connected in a tree-like form in a plurality of stages, and the pass bands of the respective branching units 24 are narrowed from the former stage toward the latter stage. Further, from the branching units in the final stage, the signal components of the bands are output in parallel through the band-pass filters 22' or not through the band-pass filters 22'. It should be noted that in the circuit configuration example shown in FIG. 9, an example in which M is 8 (M=8) is shown.

The signal x(t) input to the input port of the circulator 23(1)' of the branching unit 24(1) in the first stage includes the predetermined frequency domain f0 to (f0+fBW) as shown in FIG. 10(a), and is input to the band-pass filter 22(1)' from the first input/output port. The pass band of the band-pass filter 22(1)' becomes, for example, half the predetermined frequency domain, i.e., {f0+(fBW/2)} to (f0+fBW), and the frequency component of the band passes through the band-pass filter 22(1)' to be input to the branching unit 24(2) of the subsequent stage. Further, the frequency component of f0 to {f0+(fBW/2)} which cannot pass through the band-pass filter 22(1)' is input to the branching unit 24(3) of the subsequent stage from the second input/output port of the circulator 23(1)' through the circulator 23(0).

The branching unit 24(2) is constituted of the circulator 23(2)' and band-pass filter 22(2)'. As shown in FIG. 10(c), from among the frequency components of {f0(fBW/2)} to {f0+fBW} input to the branching unit 24(2), the frequency components of, for example, half the above band, i.e., {f0+(3fBW/4)} to (f0+fBW) are extracted by the band-pass filter 22(2)', and are input to the branching unit 24(4) of the final stage. The frequency components of {f0+(fBW/2)} to {f0+(3fBW/4)} shown in FIG. 10(c) which cannot pass through the band-pass filter 22(2)' are input to the branching unit 24(5) of the final stage.

On the other band, the branching unit 24(3) is constituted of the circulator 23(3)' and band-pass filter 22(3)'. From among the frequency components of f0 to {f0+(fBW/2)} input to the branching unit 24(3) shown in FIG. 10(b), the frequency components of, for example, half the above band, i.e., {f0+(fBW/4)} to {f0+(fBW/2)} are extracted by the band-pass filter 22(3)', and are input to the branching unit 24(6) of the final stage. The frequency components of f0 to {f0+(fBW/4)} which cannot pass through the band-pass filter 22(3)' are input to the branching unit 24(7) of the final stage as shown in FIG. 10(d).

In the branching unit 24(4), from among the input frequency components of {f0+(3fBW/4)} to (f0+fBW), the frequency components of, for example, half the above band, i.e., {f0+(7fBW/8)} to (f0+fBW) are extracted and output by the band-pass filter 22(4)' as shown in FIG. 10(d). The frequency components of {f0+(3fBW/4)} to {f0+(7fBW/8)} which cannot pass through the band-pass filter 22(4)' are output from the second input/output port of the circulator 23(4)' as shown in FIG. 10(d).

Further, in the branching unit 24(5), from among the input frequency components of {f0+(fBW/2)} to {f0+(3fBW/4)}, the frequency components of, for example, half the above band, i.e., {f0+(5fBW/8)} to {f0+(3fBW/4)} are extracted and output by the band-pass-filter 22(5)' as shown in FIG. 10(d). The frequency components of {f0+(fBW/2)} to {f0+(5fBW/8)} which cannot pass through the band-pass filter 22(5)' are output from the second input/output port of the circulator 23(5)' as shown in FIG. 10(d).

Further, in the branching unit 24(6), from among the input frequency components of {f0+(fBW/4)} to {f0+(fBW/2)}, the frequency components of, for example, half the above band, i.e., {f0+(3fBW/8)} to {f0+(fBW/2)} are extracted and output by the band-pass filter 22(6)' as shown in FIG. 10(d). The frequency components of {f0+(fBW/4)} to {f0+(3fBW/8)} which cannot pass through the band-pass filter 22(6)' are output from the second input/output port of the circulator 23(6)' as shown in FIG. 10(d).

Furthermore, in the branching unit 24(7), from among the input frequency components of f0 to {f0+(fBW/4)}, the frequency components of, for example, half the above band, i.e., {f0+(fBW/8)} to {f0+(fBW/4)} are extracted and output by the band-pass filter 22(7)' as shown in FIG. 10(d). The frequency components of f0 to {f0+(fBW/8)} which cannot pass through the band-pass filter 22(7)' are output from the second input/output port of the circulator 23(7)' as shown in FIG. 10(d).

It should be noted that the second input/output port of the circulator 23(0) is terminated by a resistor R corresponding to the characteristic impedance of the circulator, and unnecessary signal components which can pass through the circulator, and are not included in the frequency domain f0 to (f0+fBW) are terminated by the resistor R.

In the signal branching section 21 of such a circuit configuration, as shown in FIGS. 10(a) to 10(d), the filter pass band of the branching unit of the latter stage (lower stage side in FIG. 10) overlaps part of the filter pass band of the branching unit of the former stage (upper stage side in FIG. 10). However, a circulator is provided between the filter of the branching unit of the former stage and the filter of the branching unit of the latter stage (lower stage side in FIG. 10), and hence the inter-influence between the filters bands of which overlap each other is small, and design of the filters is made easy.

It should be noted that in the above circuit configuration example, in a circuit in which M is set at, for example, 16 (M=16), it is sufficient if a branching unit is provided at each of the outputs of the four branching units of the final stage in FIG. 9 to thereby subdivide the band. That is, it is possible to configure a circuit by using (M−1) branching units for the required number M of bands.

As described above, in the signal branching section in which circulators are used, it is possible to make the frequency domain of the signal to be converted variable by making the pass band of the band-pass filter variable. However, the variability of the frequency domain can also be realized by increasing the number of band-pass filters, and selecting the filters by using switches.

Figure 11:
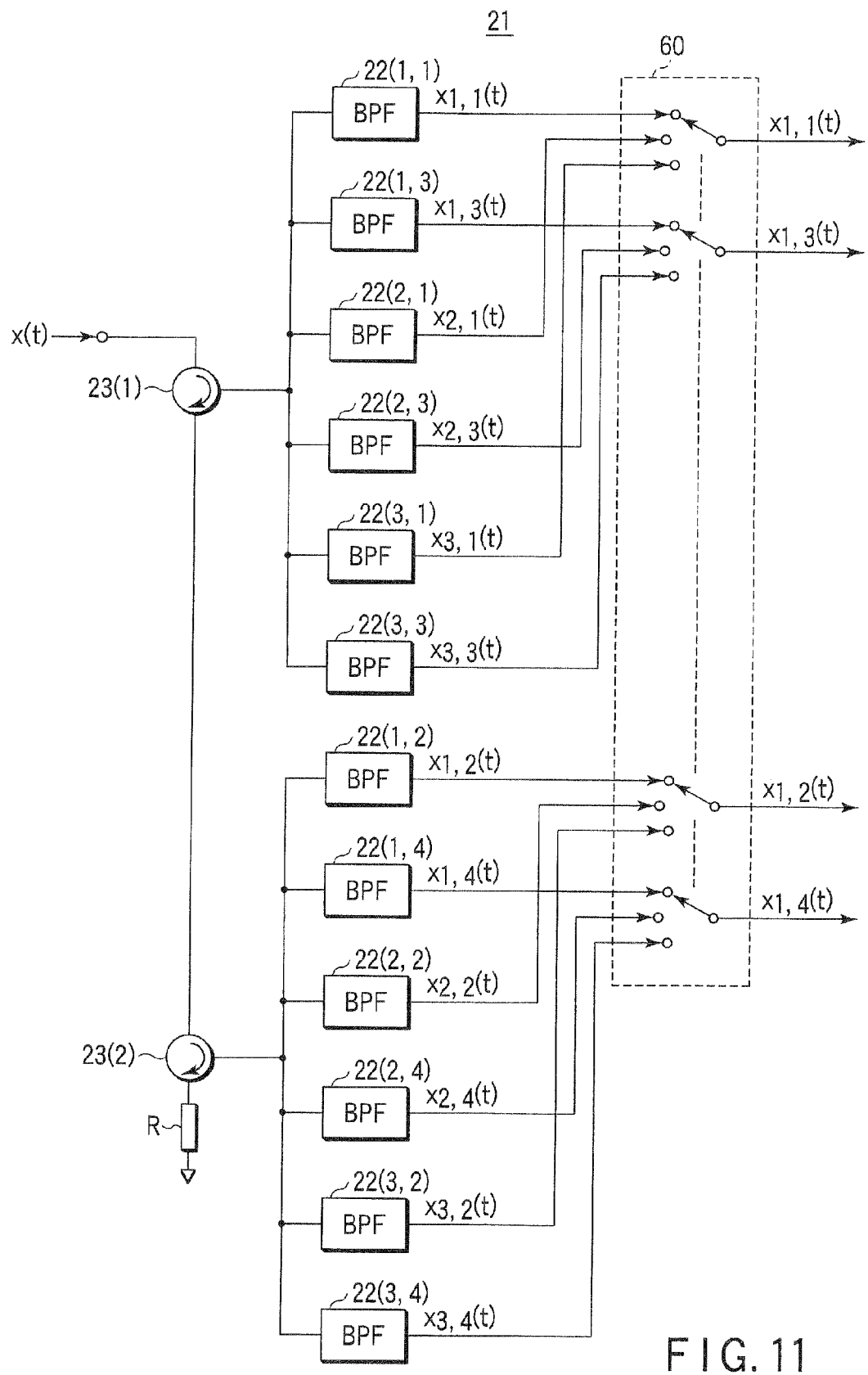
FIG. 11 is a block diagram showing the circuit configuration according to further still another example of the signal branching section shown in FIG. 1.

FIG. 11 shows one circuit example of the above, and shows a circuit configuration in which the frequency domain of the signal to be converted can be varied to three bands, and each of the bands can be divided into four zones.

In this case, band-pass filters 22(1, 1) to 22(1, 4) for dividing the band 1 into four zones are grouped into combinations of filters bands of which are not adjacent to each other, i.e., a group of the band-pass filters 22(1, 1) and 22(1, 3), and group of the band-pass filters 22(1, 2) and 22(1,4). Regarding the other bands, the filters are grouped in the same manner, a filter group constituting one combination of each band is connected to the first input/output port of the circulator 23(1), and a filter group constituting the other combination is connected to the first input/output port of the circulator 23(2). Further, an output x(i, 1) to x(i, 4) of a filter of the desired band (i) is selected and output by the switch 60.

FIGS. 12(a) and 12(b) show the relationship between the first group and second group of the signal branching section 21 of this circuit configuration in the pass band and switch selection. In this circuit configuration, the bands of the filters of the first group and those of the second group are separate from each other, and hence the inter-influence between the filters connected in parallel with each other is small, and the disturbance due to the above inter-influence is insignificant, whereby the filter design is facilitated.

Further, in the above embodiment, a circuit example in which the frequency converter 27(1) to 27(M) of the frequency converting section 26 is constituted of the mixer 27a and band-pass filter 27b is shown in FIG. 3. However, the frequency converter 27 can also be configured as shown by the circuit configuration of FIG. 13. It should be noted that in FIG. 13, for the sake of simplification of description, although only one frequency converter 27(i) is shown, the other frequency converters can also be realized by the identical circuit configuration.

This frequency converter 27(i) is constituted of an input signal in-phase distributor 44 for in-phase branching a signal of each band into K (K is an integer equal to or larger than 1) (K=4 in this example) signals, and local signal in-phase distributor 45 for in-phase branching a local signal L1 into K signals. Further, the frequency converter 27(i) is further constituted of a plurality of (K) mixers 461 to 46K for receiving and mixing signals x(i, 1) to x(i, K) in-phase branched by the input signal in-phase distributor 44, and local signals L(i, 1) to L(i, K) in-phase branched by the local signal in-phase distributor 45, and synthesizer 47 for adding Up and combining outputs of the plurality of mixers 461 to 46K. An output yi of this frequency converter 27(i) is converted into digital signals Yi by a corresponding A/D converter 30(i).

As described above, by distribution-inputting a signal of a band into a plurality of (K) mixers, it is possible to prevent each mixer from receiving an excessive input, and reduce harmonic distortion and inter-modulation distortion caused by the excessive input.

Further, as for the signal components, the components are in phase with each other, and are correlated with each other. Accordingly, when the signal components are added up and combined with each other, whereas an output K (the number of mixers) times as large as the input can be obtained, the noise components occurring in the mixers are non-correlative, and when the noise components are added up and combined with each other, the noise itself is multiplied by only $\sqrt{K}$. That is when K is 4 (K=4), the S/N ratio is improved by about 6 dB.

Figure 14:
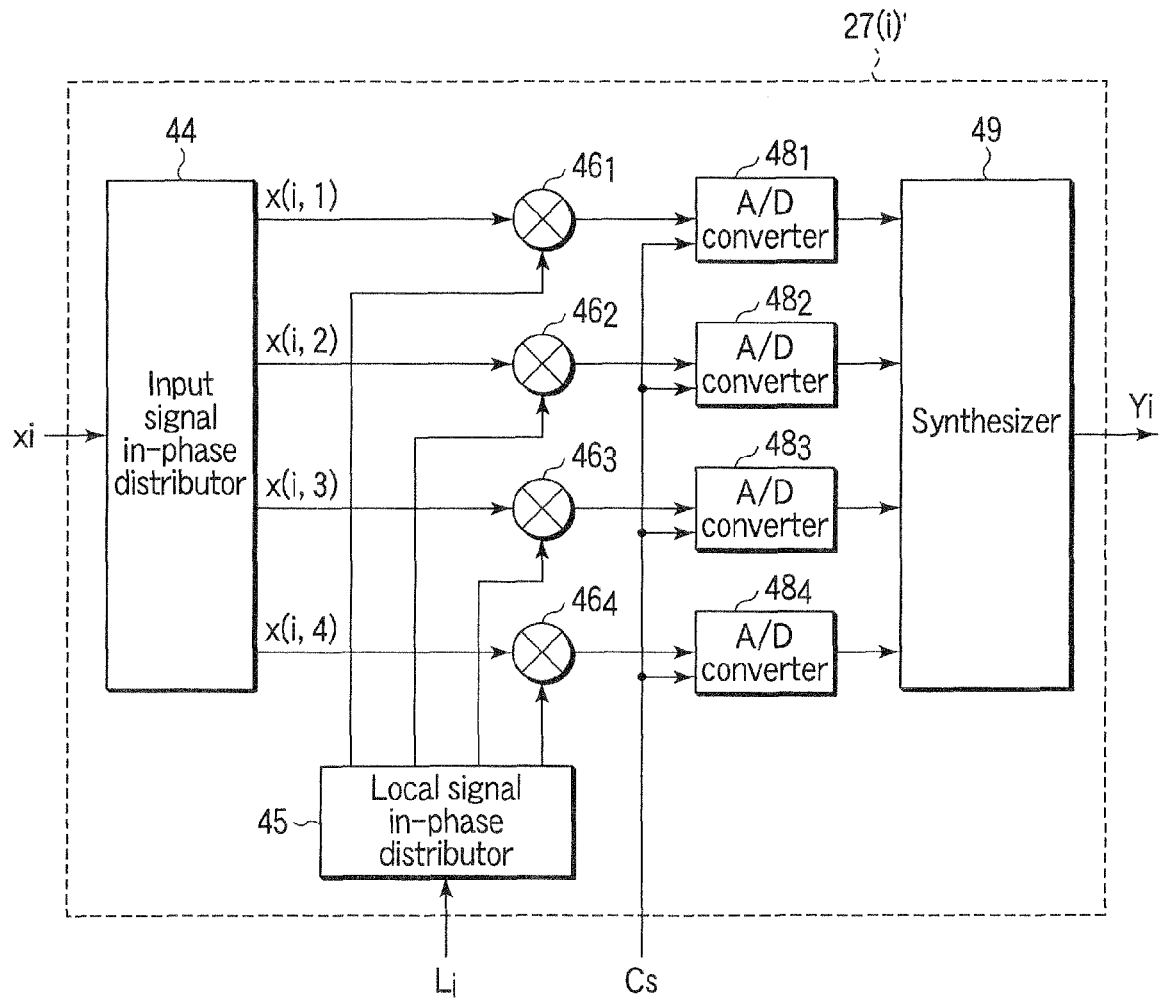
FIG. 14 is a block diagram showing the circuit configuration according to still another example of the frequency converter of the frequency converting section shown in FIG. 1.
Figure 15:
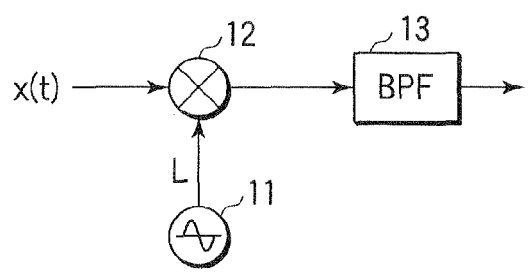
FIG. 15 is a block diagram showing the circuit configuration of a conventional frequency converting system.

In the frequency converting section 26 described above, the output of each analog type frequency converter 27 is converted into a digital value by each A/D converter 30. As in the frequency converter 27(i)' shown in FIG. 14, outputs of respective mixers 461 to 46K are input to respective A/D converters 481 to 48K, then are converted into digital signals Y(i, 1) to Y(i, K) by using a common sampling clock Cs, and are then added up and combined with each other by a digital type synthesizer 49 (numerical value adder), whereby it is also possible to obtain digital signals Yi. In this circuit configuration, the frequency converting section 26 is constituted only of the plurality of frequency converters 27(1)' to 27(M)', and the A/D converters 30(1) to 30(M) described previously are made unnecessary.

In this circuit configuration, not only the effect of preventing an excessive input to the mixer, and S/N ratio improving effect, but also the effect of preventing each A/D converter 481 to 48K from receiving an excessive input can be obtained.

As has been described above, according to the frequency converting system of the present invention, even in the case of a broadband signal, the signal is branched into signals of a plurality of bands, and the signals are respectively subjected to frequency conversion processing, and hence distortion resulting from saturation of the mixers of the frequency converters is prevented from occurring, and real-time signal analysis in the high dynamic range, and with a high S/N ratio is enabled.

Further, in the circuit configuration in which circulators and band-pass filters are used as the signal branching section, the inter-influence between the filters bands of which are adjacent to each other or overlap each other is reduced, design of the filter is facilitated, and it is made easy to cope with the filter of the variable-frequency type.

Further, in the configuration in which each of the analog type frequency converters constituting the frequency converting section is configured in such a manner that an input signal for one band is in-phase branched into a plurality of signals to be input to a plurality of mixers, the signals are subjected to frequency conversion processing by using in-phase local signals, and the outputs are combined with each other, an excessive input to the mixers is further reduced, whereby harmonic distortion and inter-modulation distortion are further suppressed. Further, whereas the signal components are added up in phase, and hence the signal is multiplied by the number of the mixers, the random noise components caused by the mixers are multiplied by only the square root of the number of the mixers, and hence the S/N ratio is improved.

Further, in the configuration in which outputs of the mixers of the above frequency converter are converted into digital signals by means of A/D converters, and thereafter the digital signals are added up to be combined with each other, in addition to the effect of preventing an excessive input to the mixer, and S/N ratio improving effect, an excessive input to the A/D converter can be prevented, and further the dynamic range becomes larger.

Further, the phase shift in each band resulting from carrying out the frequency conversion and A/D conversion processing for each of the plurality of divided bands is corrected in the correction processor, and thereafter the signal regeneration processing in the desired band is carried out. Accordingly, it is possible to accurately reproduce the phase information of the original signal, and accurately carry out the regeneration processing of the digital modulation signal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency converting system comprising:

an input part to which an input signal x(t) including a predetermined frequency domain {f0 to (f0+fBW)} is input, wherein an analog signal to be converted is included in the predetermined frequency domain, and wherein the input part includes a signal branching section for dividing the predetermined frequency domain (f0 to f0+fBW) into M bands, and extracting signal components of the respective divided bands to output the extracted signal components in parallel with each other, wherein M is an integer;

a local signal generation part including M local signal generators which are provided to correspond to the signals of the respective bands output from the signal branching section, wherein the M local signal generators output M local signals each having a frequency (fc1±fi, fc2±fi, . . ., fcM±fi) including a difference corresponding to a predetermined intermediate frequency (fi) with respect to a center frequency (fc1 to fcM) of the band;

a frequency converting part which respectively mixes the signals of the respective bands output from the signal branching section, and the local signals corresponding to the signals of the respective bands output from the local signal generators with each other to convert the signals of the bands into signals of intermediate frequency bands each including the intermediate frequency as the center frequency, wherein the frequency converting part converts the signals of the intermediate frequency bands into digital signals, and outputs the converted digital signals; and a signal regeneration part for subjecting the digital signals output from the frequency converting part to frequency conversion processing, combining the digital signals subjected to the frequency conversion processing with each other, and regenerating the signal included in the predetermined frequency domain as a digital signal of a frequency domain (f0' to f0'+fBW) with a width identical with the width of the predetermined frequency domain;

wherein the signal branching section includes plural branching units, each of which comprises a circulator and a band-pass filter connected to a first input/output port of the circulator closer to an input port of the circulator when viewed from the input port in a signal transmission direction, wherein the plural branching units are for extracting, in a pass band narrower than the predetermined frequency domain, a signal component of at least one of the divided bands, and for separating a signal input to the input port of the circulator into signal components extracted by the band-pass filter, and signal components output from a second input/output port of the circulator farther from the input port of the circulator when viewed from the input port in the signal transmission direction, and wherein the plural branching units are connected in a tree-like form in a plurality of stages in a state where the pass band widths of the branching units are narrowed from a former stage toward a latter stage, and the signal components of the respective bands are output in parallel from the respective branching units in a final stage.

2. A frequency converting system comprising:

an input part to which an input signal x(t) including a predetermined frequency domain {f0 to (f0+fBW)} is input, wherein an analog signal to be converted is included in the predetermined frequency domain, and wherein the input part includes a signal branching section for dividing the predetermined frequency domain (f0 to f0+fBW) into M bands, and extracting signal components of the respective divided bands to output the extracted signal components in parallel with each other, wherein M is an integer;

a local signal generation part including M local signal generators which are provided to correspond to the signals of the respective bands output from the signal branching section, wherein the M local signal generators output M local signals each having a frequency (fc1±fi, fc2±fi, ..., fcM±fi) including a difference corresponding to a predetermined intermediate frequency (fi) with respect to a center frequency (fc1 to fcM) of the band;

a frequency converting part which respectively mixes the signals of the respective bands output from the signal branching section, and the local signals corresponding to the signals of the respective bands output from the local signal generators with each other to convert the signals of the bands into signals of intermediate frequency bands each including the intermediate frequency as the center frequency, wherein the frequency converting part converts the signals of the intermediate frequency bands into digital signals, and outputs the converted digital signals; and a signal regeneration part for subjecting the digital signals output from the frequency converting part to frequency conversion processing, combining the digital signals subjected to the frequency conversion processing with each other, and regenerating the signal included in the predetermined frequency domain as a digital signal of a frequency domain (f0' to f0'+fBW) with a width identical with the width of the predetermined frequency domain;

wherein the frequency converting part comprises:
 a plurality of frequency converters for mixing the signals of the respective bands output from the signal branching section, and the local signals output from the local signal generators corresponding to the signals of the respective bands with each other to convert the signals of the bands into the signals of the intermediate frequency bands each including the intermediate frequency as the center frequency, and
 M A/D converters for converting the signals of the intermediate frequency bands converted by the plurality of frequency converters into the digital signals by using a common sampling clock, and outputting the respective digital signals, and wherein each of the frequency converters comprises:
 an input signal in-phase distributor for in-phase branching a signal of each band into a plurality of (K) signals,
 a local signal in-phase distributor for in-phase branching the local signal into K signals,
 a plurality of (K) mixers for receiving the signals in-phase branched by the input signal in-phase distributor, and the local signals in-phase branched by the local signal in-phase distributor, and mixing the received signals with each other, and
 a synthesizer for adding up and combining output of the plurality of mixers with each other.

3. A frequency converting system comprising:

an input part to which an input signal x(t) including a predetermined frequency domain {f0 to (f0+fBW)} is input, wherein an analog signal to be converted is included in the predetermined frequency domain, and wherein the input part includes a signal branching section for dividing the predetermined frequency domain (f0 to f0+fBW) into M bands, and extracting signal components of the respective divided bands to output the extracted signal components in parallel with each other, wherein M is an integer;

a local signal generation part including M local signal generators which are provided to correspond to the signals of the respective bands output from the signal branching section, wherein the M local signal generators output M local signals each having a frequency (fc1±fi, fc2±fi, ..., fcM±fi) including a difference corresponding to a predetermined intermediate frequency (fi) with respect to a center frequency (fc1 to fcM) of the band;

a frequency converting part which respectively mixes the signals of the respective bands output from the signal branching section, and the local signals corresponding to the signals of the respective bands output from the local signal generators with each other to convert the signals of the bands into signals of intermediate frequency bands each including the intermediate frequency as the center frequency, wherein the frequency converting part converts the signals of the intermediate frequency bands into digital signals, and outputs the converted digital signals; and a signal regeneration part for subjecting the digital signals output from the frequency converting part to frequency conversion processing, combining the digital signals subjected to the frequency conversion processing with each other, and regenerating the signal included in the predetermined frequency domain as a digital signal of a frequency domain (f0' to f0'+fBW) with a width identical with the width of the predetermined frequency domain;

wherein the frequency converting part comprises M frequency converters for mixing the signals of the respective bands output from the signal branching section, and the local signals output from the local signal generators corresponding to the signals of the respective bands with each other to convert the signals of the bands into the signals of the intermediate frequency bands each including the intermediate frequency as the center frequency, wherein the M frequency converters convert the intermediate-frequency-band-converted signals into the digital signals, and outputs the digital signals, and wherein each of the frequency converters comprises:
 an input signal in-phase distributor for in-phase branching a signal of a band into a plurality of (K) signals, a local signal in-phase distributor for in-phase branching the local signal into K signals, a plurality of (K) mixers for receiving the signals in-phase branched by the input signal in-phase distributor, and the local signals in-phase branched by the local signal in-phase distributor, and mixing the received signals with each other, a plurality of (K) A/D converters for converting outputs of the plurality of mixers into digital signals by using a common sampling clock, and a synthesizer for adding up and combining outputs of the plurality of A/D converters with each other.

* * * * *